(12) United States Patent
Ono

(10) Patent No.: US 6,333,572 B1
(45) Date of Patent: *Dec. 25, 2001

(54) ARTICLE POSITIONING APPARATUS AND EXPOSING APPARATUS HAVING THE ARTICLE POSITIONING APPARATUS

(75) Inventor: Kazuya Ono, Kanagawa (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/702,887

(22) Filed: Nov. 1, 2000

Related U.S. Application Data

(63) Continuation of application No. 09/039,518, filed on Mar. 16, 1998.

(30) Foreign Application Priority Data

Mar. 17, 1997 (JP) .................................. 9-063164
Mar. 17, 1997 (JP) .................................. 9-063165

(51) Int. Cl.$^7$ .................................. B65G 49/07
(52) U.S. Cl. .................................. 310/12
(58) Field of Search .................. 310/12; 414/935, 414/936

(56) References Cited

U.S. PATENT DOCUMENTS

| | | | |
|---|---|---|---|
| 4,535,278 | 8/1985 | Asakawa | 318/687 |
| 4,654,571 | 3/1987 | Hinds | 310/687 |
| 4,742,286 | 5/1988 | Phillips | 318/640 |
| 4,848,536 | 7/1989 | Machida | 198/619 |
| 5,196,745 | 3/1993 | Trumper | 310/12 |
| 5,789,843 | 8/1998 | Higuchi et al. | 310/309 |
| 6,160,338 | * 12/2000 | Ono | 310/309 |

FOREIGN PATENT DOCUMENTS

| | | |
|---|---|---|
| 6-14520 | 1/1994 | (JP) . |
| 8-168271 | 6/1996 | (JP) . |

OTHER PUBLICATIONS

Ford, Roger, et al.; "Noncontact Semiconductor Wafer Handling"; Techinical Paper (MS90–478), 1990; pp. MS90–478–1 thru MS90–478–10 (Month unknown).

* cited by examiner

Primary Examiner—Nestor Ramirez
Assistant Examiner—Judson H. Jones
(74) Attorney, Agent, or Firm—Foley & Lardner

(57) ABSTRACT

There is disclosed an article positioning apparatus for positioning an article composed of an electric conductive material over a predetermined base, the apparatus comprising: levitating means for levitating the article over the base; driving force generating means including current generating means for inducing a current in the article and magnetic field generating means for generating a magnetic field in a direction perpendicular to the current induced by the current generating means, and the driving force generating means being for generating a driving force composed of Lorentz force to the article in the direction perpendicular to the current and the magnetic field; and displacement detecting means for detecting a displacement of the article, wherein the article is positioned through the driving force generating means in accordance with a result detected by the displacement detecting means.

54 Claims, 18 Drawing Sheets

ARTICLE POSITIONING APPARATUS AND EXPOSING APPARATUS HAVING THE ARTICLE POSITIONING APPARATUS

This application is a Con of Ser. No. 09/039,518 filed Mar. 16, 1998.

BACKGROUND OF THE INVENTION

1. Field of the Invention

The present invention relates to a positioning apparatus for positioning a plate-shaped article such as a semiconductor wafer without contact with the article and an exposing apparatus having this positioning apparatus.

2. Related Background Art

For a photolithography process for manufacturing a semiconductor device, a liquid crystal display device, a thin-film magnetic head or the like, a projecting/exposing apparatus (a stepper or the like) for transferring a pattern of a reticle used as a mask onto each shot region on a wafer (or a glass plate or the like) used as a photosensitive substrate through a projection optical system and an exposing apparatus or the like using a proximity method for transferring the reticle pattern directly on the wafer have been heretofore used. Since such an exposing apparatus is required to position the wafer in an exposure position with high precision, the wafer is held on a wafer holder by a vacuum absorption or the like and this wafer holder is fixed on a wafer stage capable of being positioned with high precision or the wafer stage capable of roughly slightly moving.

FIG. 17 shows an example of the wafer stage of the prior-art exposing apparatus. Referring to FIG. 12, a Y stage 102 is placed on a wafer base 101 so that it may be driven in a Y-direction by a driving motor, and an X stage 103 is placed on the Y stage 102 so that it may be driven in an X-direction by the driving motor. Furthermore, a mounting support 104 is mounted on the X stage 103, a wafer holder 105 is fixed on the mounting support 104, and a wafer 106 is held on the wafer holder 105 by the vacuum absorption. Movable mirrors 107, 108 for a laser interferometer are also fixed near the wafer holder 105 on the mounting support 104 so that they may be perpendicular to each other. In this case, the mounting support 104 can position the wafer 106 in a Z-direction and in a direction of rotation about an axis parallel to a Z-axis and can correct an inclined angle of the wafer 106 (that is, an angle of rotation about the axes parallel to an X-axis and a Y-axis).

When a deformation such as a local curvature is caused on the wafer, a reticle image is not transferred on the shot region near such a deformed region with high resolution. Therefore, proposed is the method in which many piezoelectric devices are buried in parallel in the wafer holder 105 and an amount of expansion/contraction (deformation) of these piezoelectric devices is partially controlled so as to thereby improve a flatness of the wafer held on the wafer holder 105.

FIG. 18 shows an example of the prior-art wafer holder. In FIG. 18, many absorbing grooves 102 are formed on a contact surface of a front surface of a wafer holder 101a with a wafer W. Air or the like in the absorbing grooves 102a is evacuated through an exhaust path 103a in the wafer holder 101, whereby the wafer W is absorbed/held on the front surface of the wafer holder 101a. On the other hand, when the thus absorbed/held wafer W is locally deformed (curved), the reticle image cannot be excellently exposed depending on the shot region on the wafer W.

As shown in FIG. 19, the wafer holder capable of correcting the flatness of the wafer is also proposed. In FIG. 19, a space is provided in a bottom portion of the exhaust path 103a in the wafer holder 101a, and many expandable/contractible piezoelectric devices 104 are attached in this space. Therefore, the amount of expansion/contraction (deformation) of the piezoelectric devices 104a is individually controlled so that the region on the front- surface of the wafer holder 101a on the piezoelectric devices 104 is deformed, whereby the flatness of the wafer W absorbed/held on the region can be improved.

FIG. 20 shows an example of the conventional wafer stage. In FIG. 20, a Y stage 106 is placed on a wafer base 105a so that it may be movable in the Y-direction, and an X stage 107 is placed on the Y stage 106a so that it may be movable in the X-direction. A slight moving stage 109 is also mounted in the X stage 107a by using four elastic hinges 108A–108D as a guide so that it can be slightly moved in the X-direction by piezoelectric devices 111, 112. The wafer W is fixed on a mounting support 113 through the wafer holder 101a. Movable mirrors 116X, 116Y for the laser interferometer are also fixed near the wafer holder 101. In this case, the X stage 107 and the Y stage 106 are operated as a rough moving stage so as to roughly position the wafer W. Then, the slight moving stage 109 and the mounting support 113 are slightly moved in the X-direction and the Y-direction, respectively, whereby the wafer W is positioned with high precision.

As described above, the wafer stage of the prior-art exposing apparatus is composed of various stages and the mounting support stacked on the wafer base. Positioning of the wafer on the mounting support is performed by, for example, the driving motor using a feed screw method or the like. As regards this fact, it has been recently needed to further improve the positioning precision of the wafer stage in response to a finer formation of the semiconductor device or the like. Moreover, since an improvement of throughput (productivity) is desired in the process of manufacturing the semiconductor device or the like, the improvement of a positioning speed of the wafer stage is also required.

Although the driving motor having a high power is needed in order to position the mounting support (wafer) at high speed with high precision by means of this conventional stacked-structure wafer stage, the use of such a driving motor causes an apparatus constitution to be large-sized and be heavy in weight. As a result, the positioning speed cannot be disadvantageously improved so much. Furthermore, if the high-power driving motor is used, the mounting support and the wafer are deformed due to heat by an influence of the heat generated by the driving motor, and thus there is a possibility that the positioning precision is deteriorated rather than improved.

In the prior art in which many piezoelectric devices are buried in the wafer holder in order to improve the local deformation of the wafer, it is also necessary to dispose many high-voltage wires for use in the piezoelectric devices in the wafer holder. Thus, the wafer holder is large-sized and the positioning speed is thus reduced, and a manufacturing cost is also disadvantageously increased.

In the above-described prior art, in case of the wafer holder of FIG. 18, the wafer W is held on the wafer holder 101 by the vacuum absorption. Thus, if a contaminant such as resist residue is put between the rear surface of the wafer W and the front surface of the wafer holder 101, the wafer W is deformed due to the contaminant. As a result, there is a possibility that a yield of a semiconductor device to be finally manufactured is reduced. On the other hand, in case of the wafer holder of FIG. 20, the flatness of the wafer W is corrected by the expansion/contraction of many piezo-electric devices 104 in the wafer holder 101. However, disadvantageously, since this method is required to arrange many high-voltage wires for the piezoelectric devices, the apparatus constitution is increased in size and complicated, which results in the higher cost.

Moreover, in the conventional wafer stage of FIG. 20, when the position of the image projected on the reticle matches to that of each shot region on the wafer, the wafer W is stepped at high speed through the X stage 107 and the Y stage 106 (the rough moving stage). Then, the slight moving stage 109 and the mounting support 113 are slightly moved through the piezoelectric devices 111, 112 and 114, 115, whereby the wafer W is finally positioned. However, for a structure for adjusting the position by pushing/pulling the slight moving stage 109 and the mounting support 113 by the piezoelectric devices, the high-speed positioning is difficult. Furthermore, since the slight moving stage 109 is large-sized and heavy in weight, the rough moving stage for driving the slight moving stage 109 at high speed requires a high thrust force. Thus, the whole stage is large-sized and a heat value gets higher, which may cause a deterioration of the positioning precision.

SUMMARY OF THE INVENTION

The present invention is made in consideration of the above problems. It is an object of the present invention to provide a positioning device capable of positioning/holding a substrate such as a semiconductor wafer at high speed with high precision and provide an article positioning apparatus for positioning an article composed of an electric conductive material over a predetermined base, the apparatus comprising; levitating units for levitating the article over the base; driving force generating units including current generating means for inducing a current in the article and magnetic field generating section for generating a magnetic.

According to the present invention, the substrate (W) is levitated over a predetermined base (4) by the levitating units. In this state, the current is induced in the substrate (W) by the current generating sections of the driving force generating units. The magnetic field is generated by the magnetic field generating sections. The displacement of the substrate (w) due to the Lorentz force is controlled in accordance with this detection result, whereby the substrate (W) is positioned at high speed with high precision without contact therewith by means of a simple constitution. More specifically, even if the semiconductor wafer is an 8-inch wafer, it is about 100 g in weight. Thus, the semiconductor wafer can be easily levitated and easily displaced by the Lorentz force.

In this case, as an example, the levitating unit comprises gas feeding units (14–16) for emitting compressed gas from an opening (13A) formed on the base (4). The compressed gas is blown off on the rear surface of the substrate (W), whereby the substrate (W) is levitated.

As another example, the levitating unit comprises a pair of attracting electrodes (58A, 58B) arranged over the substrate (W), and a predetermined voltage is applied between the pair of attracting electrodes, whereby the substrate (W) is attracted and levitated by an electrostatic attraction force.

As an example, the current generating section has a plurality of electrodes (18A, 18B) arranged on the front surface of the base (4), and a predetermined driving voltage is applied between a pair of adjacent electrodes (18A, 18B), whereby the current is flowed between regions on the substrate (W) opposite to the pair of electrodes. Thus, the current can be flowed on the substrate (W) without contact with the substrate (W).

In this case, preferably, the apparatus further comprises an electrostatic capacity detecting unit (26) for detecting a change in an electrostatic capacity caused due to the change in the distance from the front surface of the electrodes (18A, 18B) for generating the current to the rear surface of the substrate (W), wherein the distance (gap) to the rear surface of the substrate is measured in accordance with the result detected by the electrostatic capacity detecting unit. According to this constitution, since the electrodes for generating the current can be also used as a gap sensor, the constitution is simplified. Furthermore, the gap is measured by the electrodes in three positions on the rear surface of the substrate (W), whereby an inclined angle of the substrate (W) can be also detected. The gap is measured by the electrodes in four positions or more, whereby the deformation such as the curvature of the substrate (W) can be also detected.

As an example, the magnetic field generating section includes magnetic field generating materials (19, 20) disposed in the base (4). Thus, the magnetic field can be generated in the direction perpendicular to the surface of the substrate (W).

Preferably, the displacement detecting unit has a plurality of edge sensors (30A–30E) arranged so as to correspond to an outer edge of the substrate (W) levitated by the levitating units and a plurality of gap sensors (18A, 18B, 26) for sensing a gap to the front or rear surface of the substrate. Since a notch is typically provided in the periphery of the substrate (W), the edge sensors are arranged in three positions or more including the notch portion, and the gap sensors are arranged in three positions or more, whereby it is possible to detect the displacement of six degrees of freedom of the substrate (W) including a three-dimensional displacement and a rotation of three degrees of freedom.

In the present invention, preferably, the apparatus further comprises attraction force generating units (18A, 18B, 24) for attracting the substrate (W) toward the base (4). The substrate (W) remains levitated over the base (4) by the levitating units. This levitating force is only adjusted, whereby the height of the substrate (W) can be controlled to some extent. By also controlling the attraction force generated by the attraction force generating units, the height of the substrate (W) can be controlled with higher accuracy.

In this case, preferably, the attraction force generating units are for applying a predetermined voltage between a pair of adjacent electrodes (18A, 18B) of the current generating section and for generating the electrostatic attraction force for attracting the substrate (W) toward the base (4). According to this constitution, since the electrodes (18A, 18B) for generating the current can be also used as one part of the attracting unit, the apparatus constitution is simplified.

Preferably, the voltage applied between a pair of adjacent electrodes (18A, 18B) of the current generating section is adjusted for each set (17A–17I), whereby the deformation of the substrate (W) is corrected. The thin/light substrate such as the semiconductor wafer can be improved in a flatness by this method without complicating/enlarging the apparatus constitution and without contact with the substrate.

Next, according to the present invention, there is provided an exposing apparatus for levitating/holding a semiconductor wafer (W) coated with a photosensitive material over the substrate holding apparatus (4) of the present invention and for exposing a mask pattern image onto the held semiconductor wafer. According to the exposing apparatus of the present invention, the semiconductor wafer (W) is positioned/held without contact therewith by the substrate holding apparatus of the present invention. Thus, even if the contaminant or the like adheres on the rear surface of the wafer, the semiconductor wafer is not deformed. Therefore, a yield of a semiconductor device or the like is improved.

According to the present invention, there is provided a positioning device for positioning a substrate (W) composed of an electric conductive material levitated/held over a predetermined base (4) without contact with the substrate, the device which comprises current generating sections (18A, 18B, 25) for generating a current in the substrate without contact with the substrate; and magnetic field generating sections (19, 20, 28) for generating a magnetic field in a direction perpendicular to the current generated by the current generating sections, wherein a driving force composed of Lorentz force is generated. According to the present invention, the substrate (W) levitated over the base can be positioned/held at high speed with high precision by means of a very simple construction.

A positioning apparatus according to the present invention is a positioning apparatus for positioning a plate-shaped article (W) composed of an electric conductive material over a predetermined base (4), the apparatus comprising: a plate-shaped holding body (7) composed of a generally rectangular electric conductive material and having a through hole (7a) for containing the plate-shaped article (W) at the center thereof; levitating units (14–16) for levitating the plate-shaped article (W) and the plate-shaped holding body (7) over the base (4); a driving unit (17A) including current generating sections (18A, 18B, 25) for inducing a current in the plate-shaped article (W) and the plate-shaped holding body (7) and magnetic field generating sections (19, 20, 28) for generating a magnetic field, the driving unit for generating a driving force composed of Lorentz force to the plate-shaped article (W) and the plate-shaped holding body (7) and for moving the article (W) and the plate-shaped holding body (7) along a front surface of the base (4) by the generated driving force; first displacement measuring units (8X, 8YA, 8YB) for measuring a displacement of the plate-shaped holding body (7); and second displacement measuring units (31A–31E) for measuring the displacement of the plate-shaped article (W) to the plate-shaped holding body (7).

According to the present invention, the plate-shaped holding body (7) and the plate-shaped article (W) are levitated over a predetermined base (4) by the levitating units. In this state, the current is induced in the article (W) and the holding body (7) by the current generating sections of a driving force generating unit. The magnetic field is generated by the magnetic field generating sections in the direction perpendicular to the induced current. The Lorentz force is generated in the direction perpendicular to the current and the magnetic field. This Lorentz force allows the plate-shaped holding body (7) and the plate-shaped article (W) to be displaced. A position of the plate-shaped article (W) is exactly determined by correcting values measured by the first displacement measuring units in accordance with the values measured by the second displacement measuring units. The displacement of the plate-shaped holding body (7) and the plate-shaped article (W) due to the Lorentz force is controlled in accordance with this detection result, whereby the plate-shaped article (W) is positioned at high speed with high precision without contact therewith. More specifically, assuming that the plate-shaped article is a semiconductor wafer, even if the semiconductor wafer is an 8-inch wafer, it is about long in weight. Thus, the semiconductor wafer can be easily levitated and easily displaced by the Lorentz force.

In this case, as an example, the levitating unit comprises gas feeding units (14–16) for emitting compressed gas from an opening (13A) formed on the base (4). The compressed gas is blown off on a rear surface of the plate-shaped article (W) and the plate-shaped holding body (7), whereby the article (W) and the holding body (7) are levitated.

As another example, the levitating unit comprises a pair of attracting electrodes (36A) arranged over the plate-shaped article (W) and the plate-shaped holding body (7), and a predetermined voltage is applied between the pair of attracting electrodes, whereby the plate-shaped article (W) and the plate-shaped holding body (7) are levitated by an electrostatic attraction force.

As an example, the current generating section has a plurality of electrodes (18A, 18B) arranged on the front surface of the base (4), and a predetermined driving voltage is applied between a pair of adjacent electrodes (18A, 18B), whereby the current is flowed between regions on the plate-shaped article (W) and the plate-shaped holding body (7) opposite to a pair of electrodes.

In this case, preferably, the positioning apparatus further comprises an electrostatic capacity detecting unit (26) for detecting a change in an electrostatic capacity caused due to the change in a distance from the front surface of the electrodes (18A, 18B) for generating the current to the rear surface of the plate-shaped article (W) and the plate-shaped holding body (7), wherein the distance (gap) to the rear surface of the plate-shaped article (W) and the plate-shaped holding body (7) is measured in accordance with the result detected by the electrostatic capacity detecting unit. According to this constitution, since the electrodes for generating the current can be also used as a gap sensor, the constitution is simplified. Furthermore, the gap is measured by the electrodes in three positions on the rear surface of the plate-shaped article (W), whereby an inclined angle of the article can be also detected. The gap is measured by the electrodes in four positions or more, whereby a deformation such as a curvature of the article can be also detected.

More preferably, the first displacement measuring units are arranged so that they may face to a side surface of the plate-shaped holding body (7) levitated by the levitating units and are the measuring units (8X, 8YA, 8YB) for measuring the displacement in at least three positions on the side surface of the plate-shaped holding body (7), and the second displacement measuring units are arranged so that they may face to an outer peripheral surface of the plate-shaped article (W) and are the measuring units (31A–31E) for measuring the displacement in at least three positions on the outer peripheral surface of the plate-shaped article (W), and the apparatus further comprises height measuring units (18A, 18B 26) arranged so as to face to the front surface or the rear surface of the plate-shaped holding body (7) and the plate-shaped article (W) and for measuring the distance to the front surface or the rear surface of the plate-shaped holding body (7) and the plate-shaped article (W).

In this case, since a notch is typically provided in the periphery of the plate-shaped article (W), the second displacement measuring units are arranged in three positions or more including the notch portion, and the distance (gap) is measured in three positions or more on a bottom surface of the plate-shaped article (W) by the height measuring units, whereby it is possible to detect the displacement of six degrees of freedom of the plate-shaped article (w) including a three-dimensional displacement and a rotation of three degrees of freedom.

As an example, the first displacement measuring unit comprises laser interferometers (8X, 8YA, 8YB) for emitting measuring light beams onto at least three positions on the side surface of the plate-shaped holding body (7) levitated by the levitating units. In this case, the displacement of the plate-shaped holding body (7) is measured in accordance with the values detected by the laser interferometers.

As an example, the second displacement measuring unit comprises a plurality of gap sensors (31A–31E) for sensing the gap between an inner wall of the through hole (7a) of the plate-shaped holding body (7) and the outer peripheral surface of the plate-shaped article (W). In this case, the displacement of the plate-shaped article (W) to the plate-shaped holding body (7) is measured in accordance with the values detected by a plurality of gap sensors.

In the above-described present invention, more preferably, the apparatus further comprises attraction force generating units (18A, 18B, 24) for attracting the plate-shaped holding body (7) and the plate-shaped article (W) toward the base (4). In the present invention, the plate-shaped holding body (7) and the plate-shaped article (W) remain levitated over the base (4) by the levitating units. This levitating force is only adjusted, whereby the height of the plate-shaped holding body or the like can be controlled to some extent. By also controlling the attraction force generated by the attraction force generating units, the height of the plate-shaped article or the like can be controlled with higher accuracy.

As an example, the attraction force generating units are for applying a predetermined voltage between a pair of adjacent electrodes (18A, 18B) of the current generating section and for generating the electrostatic attraction force for attracting the plate-shaped holding body (7) and the plate-shaped article (W) toward the base (4). According to this constitution, since the electrodes (18A, 18B) for generating the current can be also used as one part of the attraction force generating unit, the apparatus constitution is simplified.

More preferably, the voltage applied between a pair of adjacent electrodes (18A, 18B) of the current generating section is adjusted for each set, thereby the deformation of the plate-shaped article (W) is corrected. The thin/light article such as the semiconductor wafer can be improved in a flatness by this method without complicating/enlarging the apparatus constitution and without contact with the article.

Next, a second positioning apparatus according to the present invention is a positioning apparatus for positioning a plate-shaped article (W) composed of an electric conductive material over a predetermined base (4A), the apparatus comprising: levitating units (14–16) for levitating the plate-shaped article (W) over the base (4A); a driving unit (17A) including current generating sections for inducing a current in the plate-shaped article (W) and magnetic field generating sections for generating a magnetic field in a direction perpendicular to the current induced by the current generating sections, the driving unit for generating a driving force composed of Lorentz force to the plate-shaped article (W) in the direction perpendicular to the current and the magnetic field and for moving the plate-shaped article (W) along the front surface of the base (4A) by the generated driving force; and measuring units (18A, 18B, 26A) for measuring a relative position of the plate-shaped article (W) to the base (4A), wherein the plate-shaped article (W) is positioned through the driving unit (17A) in accordance with the position of the plate-shaped article (W) measured by the measuring units without contact therewith.

According to the another positioning apparatus of the present invention, a single plate-shaped article (W) alone is levitated and positioned at high speed. Thus, for example, when the plate-shaped article (W) is the semiconductor wafer, the position cannot be detected by emitting the laser beams onto the side surface of the plate-shaped article (W). Therefore, in the present invention, for example, a horizontal displacement of the plate-shaped article (W) to the base (4) is detected on the bottom surface of the plate-shaped article (W) by the use of the measuring units, whereby the positioning is performed in accordance with this-detection result.

In this case, as an example, the measuring unit has a plurality of electrodes (18A, 18B) arranged on the front surface of the base (4), and the position of the plate-shaped article is measured in accordance with the change in the electrostatic capacity caused between the rear surface of the plate-shaped article (W) and a plurality of electrodes (18A, 18B).

Next, an exposing apparatus of the present invention comprises the first or second positioning apparatus of the present invention and is for exposing a mask pattern image onto a semiconductor wafer (W) positioned by the positioning apparatus. In this case, since the semiconductor wafer (W) is the electric conductive material, it can be driven at high speed without contact with the wafer by the positioning apparatus of the present invention. Since the semiconductor wafer (W) is held without contact with the wafer, the rear surface thereof is not influenced by a contaminant or the like.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

An embodiment of the present invention will be described below with reference to FIGS. 1–8. This embodiment is an application of the present invention to a semiconductor wafer positioning section in a projecting/exposing apparatus.

Figure 1:
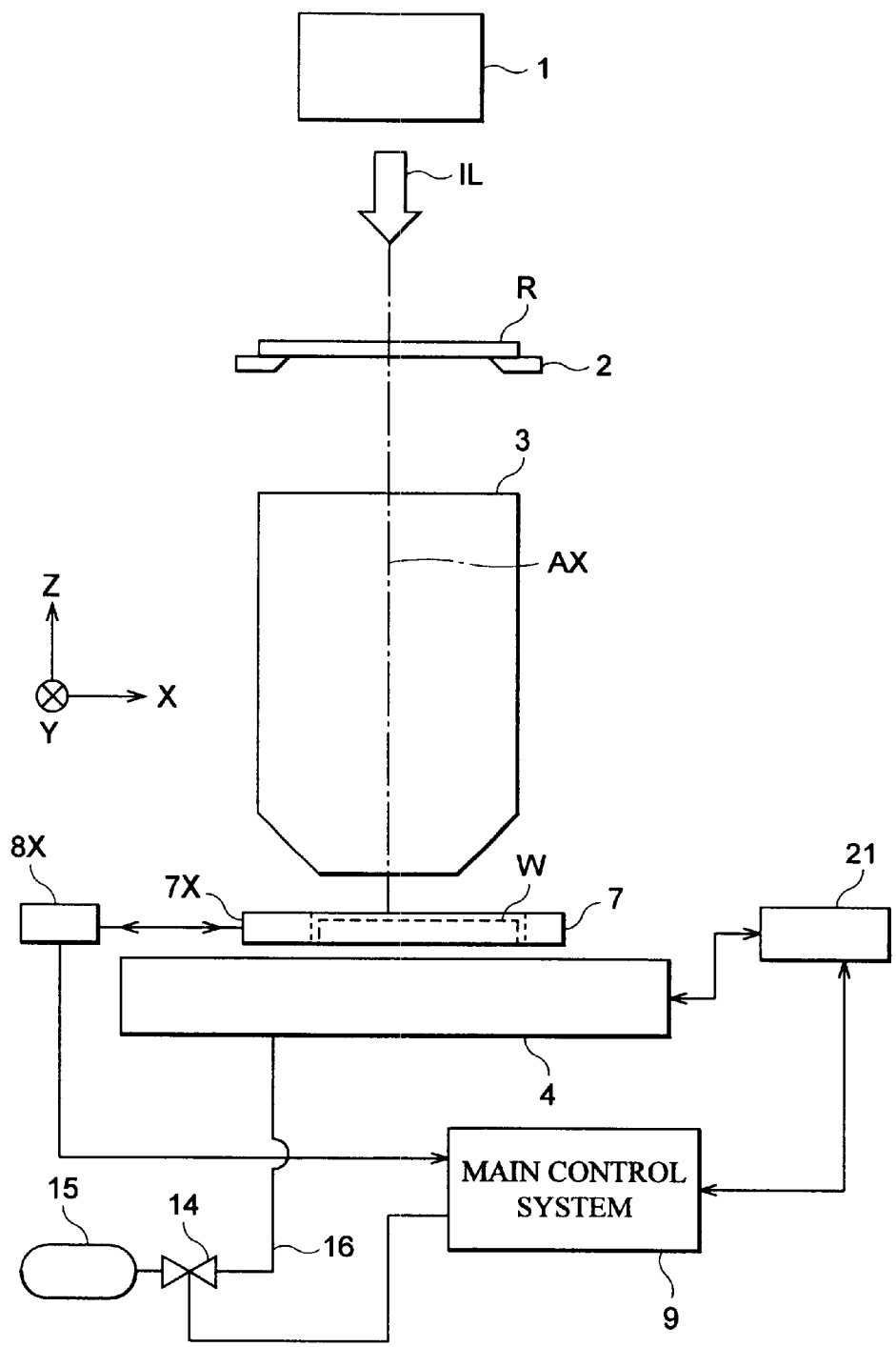
FIG. 1 shows a schematic constitution of a projecting/exposing apparatus according to a first embodiment of the present invention.

FIG. 1 shows a schematic constitution of the projecting/exposing apparatus according to this embodiment. In FIG. 1, a pattern formed on a lower surface of a reticle R is illuminated by an exposing light IL (an emission line such as an i line of a mercury vapor lamp, an excimer laser light or the like) from an illumination optical system 1 so that it may have a uniform illumination distribution. Under the exposing light IL, the pattern on the reticle R is projected onto a predetermined shot region on a semiconductor wafer W (hereinafter referred to as a 'wafer') through a projection optical system 3 at a predetermined reducing magnification β (where, for example, β is indicative of ¼, ⅕ or the like). A front surface of the wafer W is coated with photoresist. Assuming that a Z-axis is set parallel to an optical axis AX of the projection optical system 3, an X-axis is set parallel to the surface of FIG. 1 in a plane perpendicular to the optical axis AX and a Y-axis is set perpendicularly to the surface of FIG. 1, the description is provided below.

The reticle R is held on a reticle stage 2 capable of slightly moving in an X-direction, a Y-direction and a direction of rotation. A position of the reticle stage 2 is controlled in accordance with values measured by laser interferometers (not shown). On the other hand, the wafer W of this embodiment is contained in a mirror plate 7 used as a plate-shaped holding body. The wafer W and the mirror plate 7 are held over a driving base 4 while they remain levitated without contact therewith. The driving base 4 is fixed on a fixed plate (not shown). A force for levitating the wafer W and the mirror plate 7 is provided by compressed air blown off from an upper surface of the driving base 4. The compressed air is supplied to the driving base 4 from an external air supply source 15 through a flow control valve 14 and an air feeding pipe 16. A main control system 9 for generally controlling an operation of the whole apparatus controls a flow rate in the flow control valve 14 (described in detail below).

Figure 2:
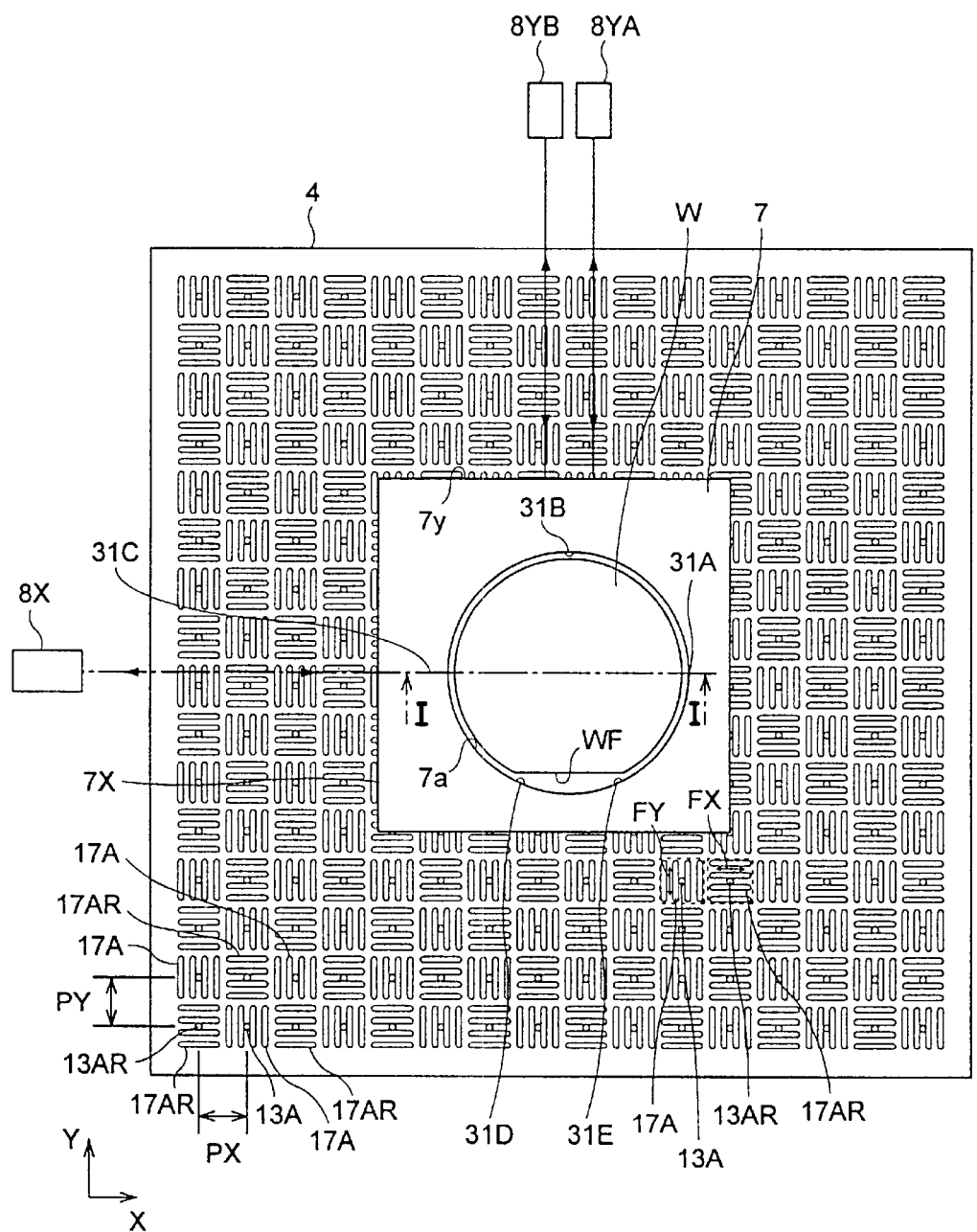
FIG. 2 is a plan view of a driving base 4, a mirror plate 7 or the like shown in FIG. 1.

FIG. 2 is a plan view of the driving base 4 shown in FIG. 1. Referring to FIG. 2, the mirror plate 7 is shaped like a rectangular plate surrounded by sides substantially parallel to the X-axis and the Y-axis. A side surface 7x in a direction of −X and a side surface 7y in a direction of +Y of the mirror plate 7 are planished. A laser beam is emitted onto the side surface 7x from a laser interferometer 8X in the direction parallel to the X-axis. The laser beams are emitted onto the side surface 7y from two parallel-arranged laser interferometers 8YA, 8YB in the direction parallel to the Y-axis. The laser interferometers 8X, 8YA, 8YB measure displacements of the corresponding side surfaces 7x, 7y at resolution of about 0.001–0.01 μm, for example. Then, they output a result of measurement to the main control system 9 shown in FIG. 1. In this case, for example, an X-coordinate and a Y-coordinate of the mirror plate 7 are determined from the value measured by the laser interferometer 8X and the average value of the values measured by the laser interferometers 8YA, 8YB, respectively. An angle of rotation of the mirror plate 7 is determined from a difference between the values measured by the two laser interferometers 8YA, 8YB on the Y-axis.

The mirror plate 7 is made of a metallic plate or an electric conductive material such as conductive ceramics, for example. A circular through hole 7a is formed in the mirror plate 7. The wafer W is contained in the through hole 7a. Electrostatic capacity type displacement meters 31A–31E for detecting a distance to a contour (edge) of the wafer W are also disposed in the through hole 7a of the mirror plate 7. The result detected by the displacement meters 31A–31E is supplied to the main control system 9 shown in FIG. 1. The displacement meters 31A–31E are manufactured by a fine processing technique for use in a manufacture of a micro-machine or the like.

In this case, the displacement meters 31D, 31E are arranged so that they may be opposite to both the ends of an orientation flat portion WF on an outer periphery of the wafer W in order to measure the angle of rotation of the wafer W with respect to the mirror plate 7. The three remaining displacement meters 31A–31C are arranged so that they may be spaced at about 90° along the circular-arc outer periphery of the wafer W in order to measure an amount of displacement of the wafer W to the mirror plate 7 in the X-direction and the Y-direction. In this embodiment, the displacement meters 31D, 31E are arranged so that they may be adapted for the orientation flat portion OF. On the other hand, when a notch portion is formed on the wafer, an arrangement of the displacement meters 31D, 31E may be changed in such a manner that it is adapted for the notch portion. The arrangement and the number of the displacement meters 31A–31E can be also changed within a range capable of detecting the displacement of the wafer W to the mirror plate 7 in the X-direction and the Y-direction and the angle of rotation of the wafer W.

Then, the main control system 9 of FIG. 1 calculates the X-coordinate and Y-coordinate of the wafer W in an XY plane and the angle of rotation of the wafer W from the values measured by the laser interferometers 8X, 8YA, 8YB and the values measured by the displacement meters 31A–31E. As described below, the driving base 4 of this embodiment is also provided with a function for displacing the wafer W and the mirror plate 7 in the XY plane without contact with them and a function for controlling the position (height), an inclined angle or the like of the wafer W and the mirror plate 7. In FIG. 1, the main control system 9 controls,the operation of the driving base 4 through a wafer driving section 21 in accordance with the position in the XY plane and the angle of rotation of the wafer W determined in the above-described manner, whereby the wafer W and the mirror plate 7 are positioned. At this time, since an expansion/contraction (deformation) of the wafer W (a change in the magnification or the like) can be also measured by the displacement meters 31A–31E, according to this embodiment, it is possible to improve a precision in overlapping a reticle image on each short region on the wafer W.

On the side surface of the projection optical system 3, arranged is an oblique-incidence focal point position detecting system (not shown) for projecting a slit image or the like on the front surface of the wafer W and for detecting an amount of defocus of the wafer W from an amount of vertical shift of the slit image reformed by the light reflected from the wafer W. In accordance with an output or the like from this focal point position detecting system, the main control system 9 controls the position in a Z-direction and the inclined angle of the wafer W through the driving base 4 by an auto-focus method and an auto-leveling method. As described below, since the driving base 4 is also provided with the function for measuring the distance to the wafer W and the mirror plate 7, the oblique-incidence focal point position detecting system may be omitted. During an exposure, when the exposure is completed in a certain shot region on the wafer W, the wafer W is stepped through the driving base 4 at high speed without contact therewith, the subsequent shot region is moved to an exposure field of the projection optical system 3 and positioned with high precision, and then the pattern image on the reticle R is projected/exposed to that shot region. The above operation is repeated by a step-and-repeat method, so that each shot region on the wafer W is exposed to the light.

As described above, the wafer W and the mirror plate 7 of this embodiment are held so that they may be levitated at a predetermined distance over the driving base 4 without contact therewith. The driving base 4 is also provided with a mechanism for positioning the wafer W and the mirror plate 7 without contact with them. The mechanisms for holding and positioning the wafer W and the mirror plate 7 without contact with them by the driving base 4 will be described below.

In the first place, as shown in FIG. 2, driving units 17A and 17AR are incorporated in all the regions on the driving base 4, in which the wafer W and the mirror plate 7 are moved, so that they may be arranged at a pitch PX in the X-direction and at a pitch PY in the Y-direction and they may have the same constitution. In this case, the one driving unit 17A is the unit for applying a driving force FY of Lorentz force in the direction of ±Y to the wafer W or the like on the upper surface thereof without contact with the wafer W. The other driving unit 17AR is the unit for applying a driving force FX of Lorentz force in the direction of ±X to the wafer W or the like on the upper surface thereof without contact with the wafer W. The driving unit 17AR is constituted by rotating the driving unit 17A by 90°. In this embodiment, the driving units 17A and 17AR are alternately arranged in the X-direction and the Y-direction. As a whole, the driving units 17A are arranged in a zigzag grid pattern (the driving units 17AR are also arranged in the same manner). The arrangement pitches PX, PY are set so that the driving units 17A and 17AR may be totally contained on the bottom surface of the wafer W in about 3-row×3-column or more at all times. Air feeding holes 13A and 13AR are also formed at the centers of the driving units 17A and 17AR, respectively. All the air feeding holes 13A and 13AR are connected to the air feeding pipe 16 shown in FIG. 1.

Figure 3:
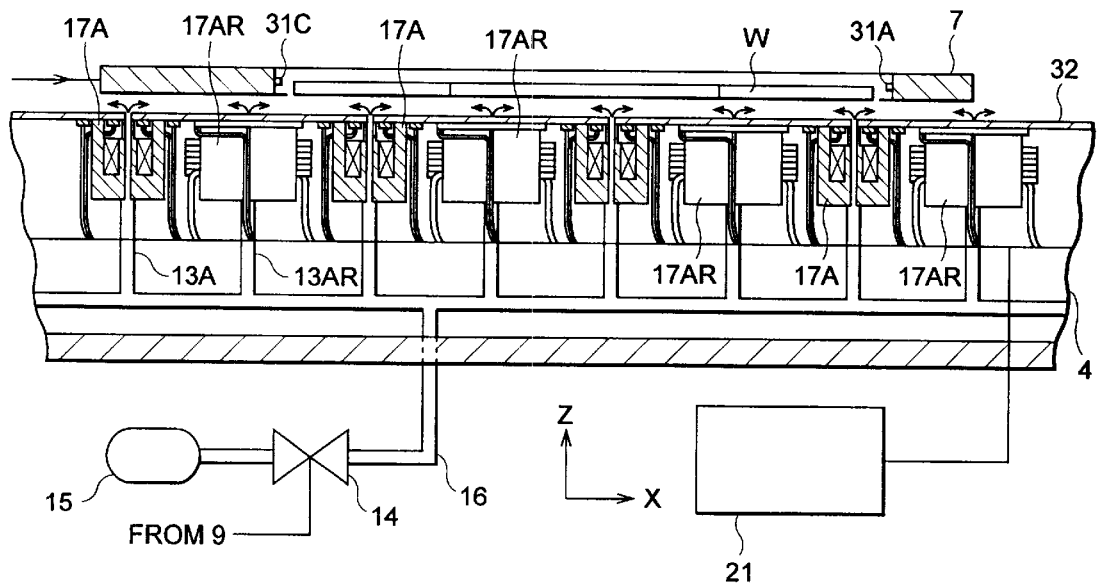
FIG. 3 is a cross sectional view taken on line 1—1 of FIG. 2.

FIG. 3 is-a cross sectional view taken on line 1—1 of FIG. 2. In FIG. 3, as a sectional surface of the driving base 4, the one driving unit 17A alone is shown in the cross sectional view, while the driving unit 17AR constituted by rotating the driving unit 17A by 90° is shown in a front view. As shown in FIG. 3, the driving units 17A and 17AR are alternately arranged at a predetermined pitch on the bottom surface of an upper plate 32 (not shown in FIG. 2) on the driving base 4. The air feeding hole 13A at the center of the driving unit 17A and the air feeding hole 13AR at the center of the driving unit 17AR are connected to the air feeding pipe 16 in the driving base 4. The compressed air (compressed nitrogen gas or the like is also possible) in the air supply source 15 is emitted from the air feeding holes 13A, 13AR on the front surface of the driving base 4 through the air feeding pipe 16, whereby the wafer W and the mirror plate 7 are levitated by the same action as a static-pressure air bearing by this compressed air layer. At this timer the main control system 9 controls the flow rate of the compressed air passing through the flow control valve 14, whereby an amount of levitation of the wafer W and the mirror plate 7 can be controlled to some extent. Even if the wafer W and the mirror plate 7 are moved in the X-direction and the Y-direction, since the driving units 17A and 17AR are arranged in the substantially whole surface of the driving base 4 of this embodiment, the wafer W and the mirror plate 7 are moved while the whole surface of the driving base 4 remains levitated. Specifically, the constitution of the driving unit 17A and the driving circuit thereof will be described below with reference to FIGS. 4–6.

Figure 4:
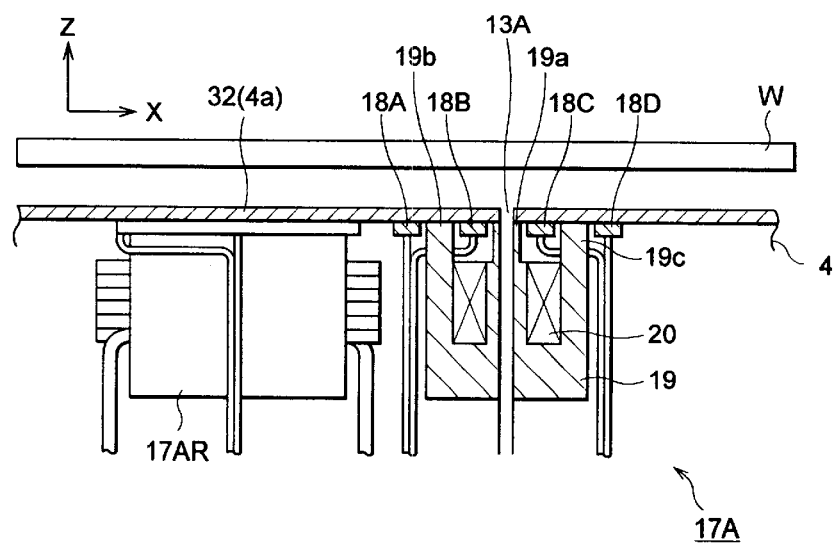
FIG. 4 is a partial enlarged view of FIG. 3.

In the first place, FIG. 4 is an enlarged view of FIG. 3. As shown in FIG. 4, electrodes 18A, 18B, 18C, 18D, composed of a flat-plate metal which is one part of the driving unit 17A and is narrow long in the Y-direction, are arranged in the X-direction on the bottom surface of the upper plate 32 of the driving base 4. In this case, the distance between a first pair of electrodes 18A and 18B in the X-direction is equal to the distance between a second pair of electrodes 18C and 18D in the X-direction, and the distance between the electrodes 18B and 18C at the center is set so that it may be larger than the distance between the first pair of electrodes and the distance between the second pair of electrodes. As an example, the upper plate 32 is made of an insulating material which is thinner than the wafer W. A generally E-shaped iron core (core) 19 is arranged under the electrodes 18A–15D. A magnetic pole 19a at the center of the iron core 19 is arranged between the electrodes 18B and 18C. Magnetic poles 19b and 19c on both the sides of the iron core 19 are arranged between the one pair of electrodes 18A and 18B and between the other pair of electrodes 18C and 18D, respectively. The air feeding hole 13A passes through the center of the central magnetic pole 19a. A coil 20 is wound around the central magnetic pole 19a. An electromagnet used as a magnetic field generating section is composed of the iron core 19 and the coil 20. The iron core 19 is made of a laminated silicon steel plate so that it can generate an alternating-current magnetic field which is changed at high speed.

Figure 5:
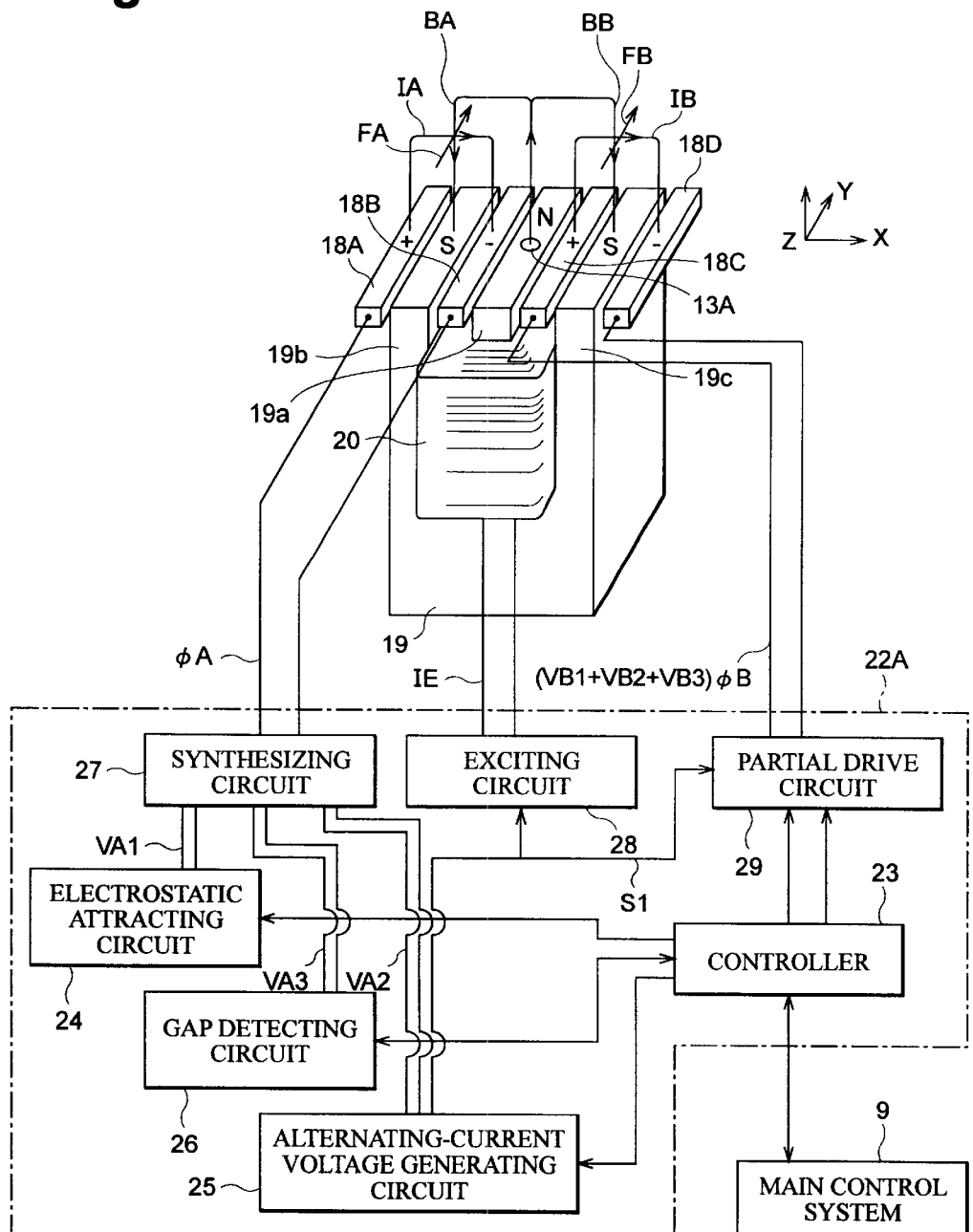
FIG. 5 shows a driving unit 17A and a driving circuit of the driving unit 17A for use in the first embodiment.

FIG. 5 is an enlarged perspective view of the driving unit 17A and shows the constitution of a driving circuit 22A of the driving unit 17A. A controller 23 composed of a microcomputer in the driving circuit 22A of FIG. 5 generally controls the operation of each circuit in the driving circuit 22A. An electrostatic attracting circuit 24, an alternating-current voltage generating circuit 25 and a gap detecting circuit 26 are disposed in the driving circuit 22A. A variable direct-current voltage VA1 is generated in the electrostatic attracting circuit 24. An alternating-current voltage VA2 of a predetermined frequency f1 and a variable amplitude is generated in the alternating-current voltage generating circuit 25. An alternating-current voltage VA3 of a high frequency (carrier frequency) f2 (>f1) is generated in the gap detecting circuit 26. The direct-current voltage VA1, the alternating-current voltage VA2 and the alternating-current voltage VA3 are synthesized in a synthesizing circuit 27 in the following manner, so that a voltage φA is generated. This voltage (potential difference)φA is applied between a pair of electrodes 18A and 18B of the driving unit 17A.

$$\phi A = VA1 \text{ (direct current)} + VA2 \text{ (frequency } f1) + VA3 \text{(frequency } f2) \quad (1)$$

An exciting circuit 28 and a partial drive circuit 29 are also disposed in the driving circuit 22A. The exciting circuit 28 supplies an alternating exciting current IE of the frequency f1 to the coil 20 constituting the electromagnet in the driving unit 17A. The partial drive circuit 29 applies a voltage (potential difference) φB between the electrodes 18C and 18D in the driving unit 17A. As expressed by the following equation, the voltage φB is the synthesized voltage of a direct-current voltage VB1 equal to the direct-current voltage VA1 generated by the electrostatic attracting circuit 24, an alternating-current voltage VB2 of the frequency f1 equal to the alternating-current voltage VA2 generated by the alternating-current voltage generating circuit 25 and an alternating-current voltage VB3 of the frequency f2 equal to the alternating-current voltage VA3 output from the gap detecting circuit 26.

$$\phi B = VB1 \text{ (direct current)} + VB2 \text{ (frequency } f1) + VB3 \text{(frequency } f2) \quad (2)$$

In this case, a synchronizing signal S1 is supplied from the alternating-current voltage generating circuit 25 to the exciting circuit 28 and the partial drive circuit 29. The component VA2 of the frequency f1 in the voltage A, the exciting current IE and the component VB2 of the frequency f1 in the voltage φB are synchronized to each other and changed. The other driving unit 17AR is also provided with the same driving circuit as the driving circuit 22A. The wafer driving section 21 of FIG. 1 is composed of these driving circuits.

The basic operation of the driving unit 17A by the alternating-current voltages VA2, VB2 of the frequency f1 in the equations (1) and (2) will be described with reference to FIG. 5. As shown in FIG. 5, assuming that the alternating-current voltage VA2 of the electrode 18A is higher than that of the electrode 18B on a certain point, the other alternating-current voltage VB2 of the electrode 18C is also higher than that of the electrode 18D. Thus, a current IA flows through the wafer W and the mirror plate 7 (not shown) over the electrodes 18A, 18B in the direction of +X, and a current IB also flows through the wafer or the like over the electrodes 18C, 18D in the direction of +X. At this time, assuming that the magnetic pole 19a at the center of the iron core 19 is N pole and the magnetic poles 19b, 19c on both the ends thereof are S pole, the magnetic field is generated from the N pole toward the S pole. Thus, a magnetic field BA is generated over the one magnetic pole 19b in the direction of −Z so that it may be perpendicular to the current IA, and a magnetic field BB is also generated over the other magnetic pole 19c in the direction of −Z so that it may be perpendicular to the current IB. Therefore, a Lorentz force FA is generated in the direction of +Y to the wafer W and the mirror plate 7 (not shown) over the one magnetic pole 19b, and a Lorentz force FB is generated in the direction of +Y to the wafer or the like over the other magnetic pole 19c.

Furthermore, in this embodiment, the alternating-current voltage VA2 and the exciting current IE are synchronized to each other. Thus, when the potential of the electrode 18B is higher than that of the electrode 18A and the current flows in the direction of −X, the magnetic pole 19b is changed into the N pole and the magnetic field is generated in the direction of +Z, so that the Lorentz force FA is thus generated in the direction of +Y. In the same manner, since the direction of the Lorentz force FB generated over the magnetic pole 19c is also fixed, the magnitude and direction of the two Lorentz forces FA, FB are the same in this embodiment. The direction of the Lorentz forces FA, FB can be changed by inverting a phase of the alternating-current voltages VA2, VB2 (the exciting current IE is also possible). The direction of the Lorentz forces FA, FB and the acting time thereof are controlled, whereby the wafer W and the mirror plate 7 over the driving unit 17A can be displaced by a desired amount in the direction of +Y or −Y. In general, since the wafer W is as light as about tens of grams (for example, even an 8-inch wafer is about 100 g in weight) and the wafer W is levitated, the wafer W can be easily moved by the Lorentz forces FA, FB. Moreover, since the mirror plate 7 has the through hole 7a, for example, as shown in FIG. 2, the mirror plate 7 can be reduced in weight and easily moved by the Lorentz force. Thus, the controller 23 of FIG. 5 outputs information on the direction of the Lorentz forces FA, FB to be generated and the acting time to the alternating-current voltage generating circuit 25 and the partial drive circuit 29. The alternating-current voltage generating circuit 25 outputs the alternating-current voltage VA2 for the acting time in response to this information. The exciting current IB and the alternating-current voltage VB2 are output in synchronization with the alternating-current voltage VA2.

Figure 6:
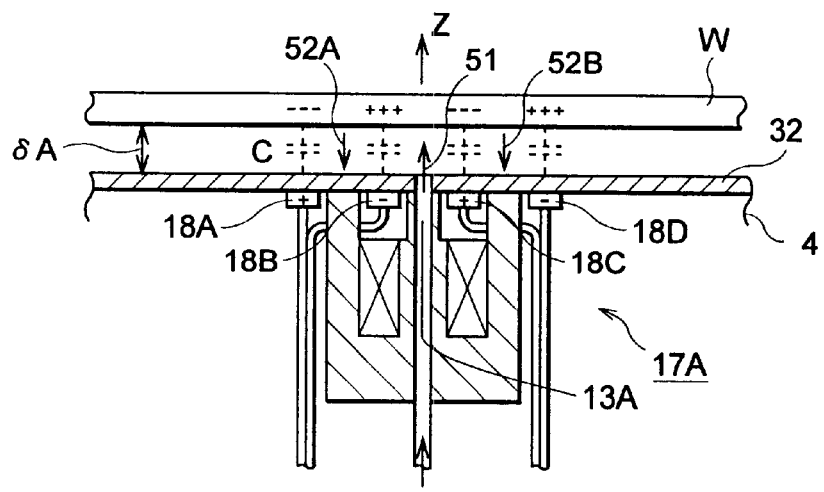
FIG. 6 is a cross sectional view for describing an operation of the driving unit 17A.

The action of the alternating-current voltages VA3 and VB3 of the high frequency f2 in the equations (1) and (2) will be described below. FIG. 6 is a cross sectional view of the driving unit 17A. In FIG. 6, the alternating-current voltage VA3 is applied between the electrodes 18A and 18B. It is acceptable to assume that a capacitor is formed between the electrodes 18A, 18B and the wafer W so that it may have a capacity C in response to a gap δA therebetween (where the gap δA is defined as the gap between the upper plate 32 and the bottom surface of the wafer W). Therefore, the capacity C can be determined from the value of the alternating current which flows while the alternating-current voltage VA3 remains applied. That is, in the gap detecting circuit 26 of FIG. 5, the capacity C is determined from the value of the alternating current flowing between the electrodes 18A, 18B while the alternating-current voltage VA3 remains applied, and then the gap δA is determined from the capacity C and output to the controller 23. A relationship between the capacity C and the gap δA is previously surveyed by the use of the standard wafer or the like, and the relationship may be stored as a predetermined function or a table in a memory in the gap detecting circuit 26.

On the side of the partial drive circuit 29, in the same manner, the gap to the water is detected by the use of the alternating-current voltage VB3 and the detection result is then output to the controller 23. As an example, the average value of two gaps can be defined as the gap to the wafer in driving unit 17A. Although the gap to the mirror plate 7 can be measured in the same manner, the gap to the mirror plate 7 need not be measured more highly precisely than the gap to the wafer. Thus, for example, the relationship for use in the wafer is used as the relationship between the capacity C and the gap δA, whereby the gap δA with respect to the mirror plate 7 may be only roughly measured.

The action of the direct-current voltages VA1 and VB1 in the equations (1) and (2) will be described below. In FIG. 6, assuming that the potential of the electrode 18A is higher than that of the electrode 18B by the direct-current voltage VA1, the bottom surface of the wafer W over the electrode 18A is negatively charged and the bottom surface of the wafer W over the electrode 18B is positively charged, so that an electrostatic attraction force 52A is generated between the electrodes 18A, 18B and the wafer W. This is also caused in the same manner by an inversion of a code of the direct-current voltage VA1. In the same manner, an electrostatic attraction force 52B is generated between the electrodes 18C, 18D and the wafer W by the direct-current voltage VB1. Then, both the electrostatic attraction forces 52A, 52B are allowed to be equal to each other and be variable, whereby the driving base 4 applies the variable attraction force to the wafer W in the direction of −Z. At this time, in this embodiment, the compressed air is blown off on the bottom surface of the wafer W from the air feeding hole 13A at the center of the driving unit 17A, so that a levitating force 51 also acts on the wafer W in the direction of +Z. Then, the controller 23 of FIG. 5 instructs the electrostatic attracting circuit 24 and the partial drive circuit 29 to increase/reduce the magnitude of the direct-current voltages VA1 and VB1 so that the gap δA detected by the gap detecting circuit 26 may be a predetermined target value. Thus, the gap δA between the wafer W and the upper plate 32 of the driving base 4 is set at a desired value.

In the same manner, when the mirror plate 7 is located over the driving unit 17A, the distance to the mirror plate 7 is controlled by the magnitude of the direct-current voltages VA1 and VB1. Although it is necessary to highly precisely set the height of the wafer W, the height of the mirror plate 7 has only to be within the range in which the wafer W therein is not removed.

As described above, the driving unit 17A shown in FIG. 5 has the function for applying the Lorentz force (the driving force FY of FIG. 2) to the wafer W and the mirror plate 7 over the driving unit 17A in the direction of ±Y, the function for measuring the distance to the wafer W and the mirror plate 7 thereover and the function for applying the electrostatic attraction force to the wafer W and the mirror plate 7 thereover. It is the to be acceptable that the electrostatic attraction force is a holding force for holding the position (height) of the wafer in the Z-direction in a desired position in combination with the levitating force generated by the compressed air. All the other driving units 17A, 17AR shown in FIG. 2 are also provided with these three functions. As regards the Lorentz force, since the driving unit 17AR is rotated by 90° with respect to the driving unit 17A, the Lorentz force (the driving force FX) generated by the driving unit 17AR acts in the direction of ±X. In this embodiment, by a combination of these Lorentz forces, the wafer W and the mirror plate 7 are displaced by a desired amount in the X-direction and the Y-direction with respect to the driving base 4, and the wafer W and the mirror plate 7 are rotated by a desired angle.

At this time, the coordinate in the X-direction and the Y-direction and the angle of rotation of the wafer W are determined from the values measured by the laser interferometers 8X, 8YA, 8YB and the values measured by the displacement meters 31A–31E. In accordance with this result, the main control system 9 gives the controller (for example, the controller 23 of FIG. 5) in the driving circuit of the driving units 17A, 17AR an instruction about to what extent the wafer W is displaced in each part. In response to this instruction, the controller 23 or the like allows the corresponding driving unit 17A or the like to generate a predetermined Lorentz force. The gap between the upper plate 32 of the driving base 4 and the bottom surface of the wafer W and the mirror plate 7 detected by the gap detecting circuit (for example, the gap detecting circuit 26 of FIG. 5) in the driving circuit of the driving units 17A, 17AR is supplied to the main control system 9 through the corresponding controller 23 or the like. The main control system 9 outputs the target value of the gap to the controller 23 or the like in accordance with this gap. In response to this output, the driving units 17A, 17AR set the distance to the wafer W and the mirror plate 7 at the designated target value.

The following description is provided for an example of the operation when the wafer W is exposed by the projecting/exposing apparatus of this embodiment. In the first place, in FIG. 1, when the wafer W is supplied into the mirror plate 7 on the driving base 4 from a wafer loader system (not shown), the main control system 9 allows the compressed air to be blown off from many air feeding holes 13A, 13AR of the driving base 4 at the standard flow rate predefined by the flow control valve 14. In such a manner, the water W and the mirror plate 7 are levitated and held over the driving base 4. After that, the main control system 9 corrects a curvature of the wafer W, for example.

Figure 7:
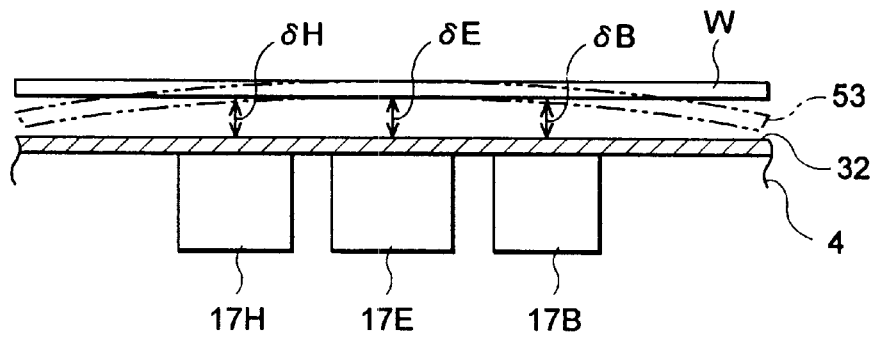
FIG. 7 is a cross sectional view for describing a correction of a curvature of a wafer W by the use of the driving unit.

FIG. 7 is a schematic cross sectional view of the driving base 4. Referring to FIG. 7, three driving units (driving units 17B, 17E, 17H in FIG. 7) in the driving base 4 are shown, and the wafer W is levitated over the driving base 4 by the compressed air. However, the wafer W is curved, and thus the outer periphery thereof is lowered as shown by two-dotted line 53 when the wafer W is only levitated. In this case, since the main control system 9 of FIG. 1 can recognize the curvature of the wafer W from the measured value of the gap in the driving units 17A, 17AR, the amount of the compressed air blown off on the bottom surface of the wafer W is increased by the flow control valve 14, whereby the levitating force acting on the wafer W is increased. In addition, the main control system 9 instructs the controller (the controller 23 or the like) of the driving units 17A, 17AR to equalize the gap to the wafer W. As a result, the central driving unit 17E of FIG. 7 strengthens the electrostatic attraction force so as to thereby keep a gap δE to the wafer W at the target value, and the driving units 17B and 17H on both the ends weaken the electrostatic attraction force so as to thereby widen gaps δB and δE to the wafer W up to the target value, whereby all the gaps δB, δE and δE are finally changed into the target value. In the same manner, the other driving units 17A, 17AR set the equal gap and correct the curvature of the wafer W.

Next, when the wafer W remains levitated while the wafer W is located in a predetermined reference position with respect to the driving base 4, the position of an alignment mark in each shot region on the wafer W is detected by the use of an alignment sensor (not shown), whereby an alignment coordinate is determined in each shot region. Thus, the positional relationship between the image projected on the reticle R and each shot region on the wafer W is determined in accordance with the values measured by the laser interferometers 8X, 8YA, 8YB and the displacement meters 31A–31E. Moreover, the gap is controlled in the driving units 17A, 17AR, whereby the auto-focus and the auto-leveling (the correction of the inclined angle) of the wafer W are also carried out. In this state, the wafer W and the mirror plate 7 are stepped through the driving base 4 without contact therewith, the shot region on the wafer W to be exposed is positioned in the exposure field of the projection optical system 3, and then the pattern image of the reticle R is exposed.

Figure 8A:
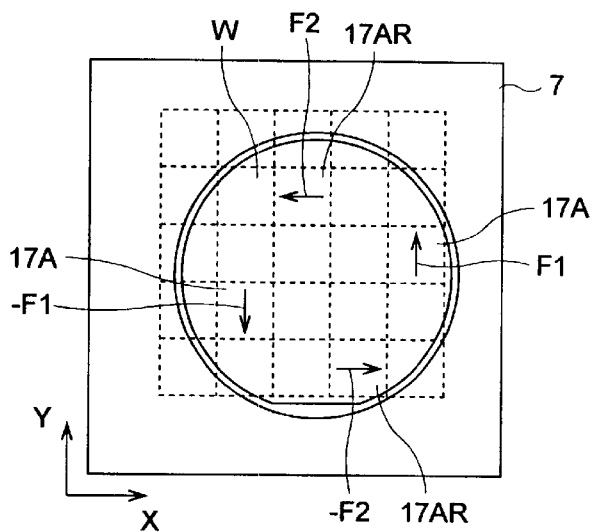
FIGS. 8A–8C illustrate rotations and drives in an X-direction and a Y-direction of the wafer W by the use of the driving unit.

In such a manner, when the wafer W and the mirror plate 7 are driven by the driving base 4 without contact therewith, the driving units 17A, 17AR are used, for example, as shown in FIG. 8. That is, first, when the amount of shift of the angle of rotation (assuming it as the amount of clockwise shift) is corrected, as shown in FIG.8A, the main control system 9 supplies the amount of displacement to the controllers of the two X-axial driving units 17AR and the two Y-axial driving units 17A on the bottom of the wafer W so that the amount of shift may be canceled. In response to this operation, counterclockwise Lorentz forces F1, F2, –F1 and –F2 act on the wafer W from the right-side driving unit 17A, the upper-side driving unit 17AR, the left-side driving unit 17A and the lower-side driving unit 17AR, respectively, so that the wafer W is counterclockwise rotated. At this time, since the angle of rotation of the wafer W is monitored in accordance with the values measured by the laser interferometers 8YA, 8YB and the displacement meters 31D, 31E of FIG. 2, the angle of rotation of the wafer W is exactly corrected in a closed loop in accordance with these measured values.

Figure 8B:
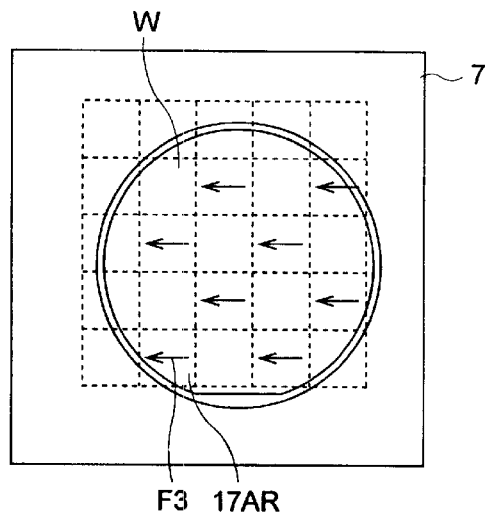
Figure 8C:
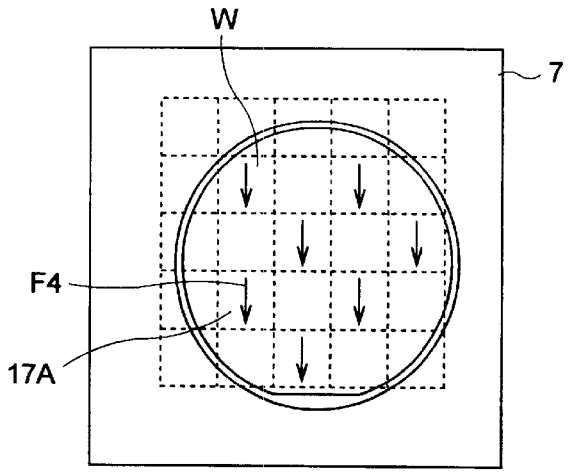

Next, when the wafer W is displaced in the direction of –X, as shown in FIGS. 8B, the main control system 9 instructs the controllers of a plurality of X-axial driving units 17AR on the bottom of the wafer W to generate the Lorentz force in the direction of –X. In response to this instruction, a Lorentz force F3 acts on the wafer W from the driving units 17AR in the direction of –X, so that the wafer W is displaced in the direction of —X. In the same manner, when the wafer W is displaced in the direction of –Y, as shown in FIG. 8C, the main control system 9 instructs the controllers of a plurality of Y-axial driving units 17A on the bottom of the wafer W to generate the Lorentz force in the direction of –Y. In response to this instruction, a Lorentz force F4 acts on the wafer W from the driving units 17A in the direction of –Y, so that-the wafer W is displaced in the direction of –Y. At this time, since the position of the wafer W in the X-direction and Y-direction is highly precisely monitored by the laser interferometers 8X, 8YA, 8YB and the displacement meters 31A–31E, the position of the wafer W is exactly corrected in the closed loop in accordance with this monitoring.

In such a manner, in this embodiment, since the wafer W is driven without contact therewith, the wafer W can be positioned at high speed. Therefore, throughput (productivity) is improved in an exposure process. Moreover, since the driving base 4 has only to drive the wafer W and the mirror plate 7, a heat value is low and the wafer W is levitated over the driving base 4, the wafer w is scarcely influenced by the heat generated by the driving base 4, and the precision in positioning the wafer W is also improved.

Furthermore, since the wafer W is levitated and held without contact therewith over the driving base 4 of this embodiment, even if a contaminant such as residue of resist adheres on a rear surface of the wafer W, the wafer W is not curved. Moreover, since the curvature or the like of the wafer W can be corrected by controlling the electrostatic attraction force by the driving units 17A, 17AR, the wafer W is flatly held during the exposure. In addition, no contact with the wafer results in no contaminant. Therefore, since the reticle image can be transferred on each shot region on the wafer W with high resolution, a yield of a semiconductor integrated circuit to be finally manufactured is improved.

In this embodiment, since the driving units 17A, 17AR can individually control the electrostatic attraction force acting on the wafer W and can individually measure the gap to the wafer W, even if the wafer W is locally deformed, the electrostatic attraction force is controlled in the driving unit on the bottom of the deformed portion, whereby the local deformation can be also easily corrected. More specifically, this is effective for the exposure on a large-sized wafer which is prone to the local deformation.

In the above-mentioned embodiment, although the constitution is simplified because the electrodes 18A, 18B for generating the driving force are also used as the gap sensor for measuring the gap to the rear surface of the wafer W, another independent gap sensor may be provided. Furthermore, in this embodiment, since there is provided the oblique-incidence focal point position detecting system (not shown) for detecting the position of the front surface of the wafer W in the Z-direction, this focal point position detecting system is adapted so that it can measure on many points, whereby the gap between the rear surface of the wafer W and the driving base 4 may be controlled in accordance with this measurement result.

A second embodiment of the present invention will be described below with reference to FIGS. 9 and 10. In the above-described embodiment, the position of the wafer W is indirectly measured through the mirror plate 7. On the other hand, in this embodiment, the position of the wafer is directly measured and the wafer alone is driven. The portions corresponding to the portions shown in FIGS. 2 and 5 have the same reference numerals in FIGS. 9 and 10, and the detailed description of the corresponding portions is omitted.

Figure 9:
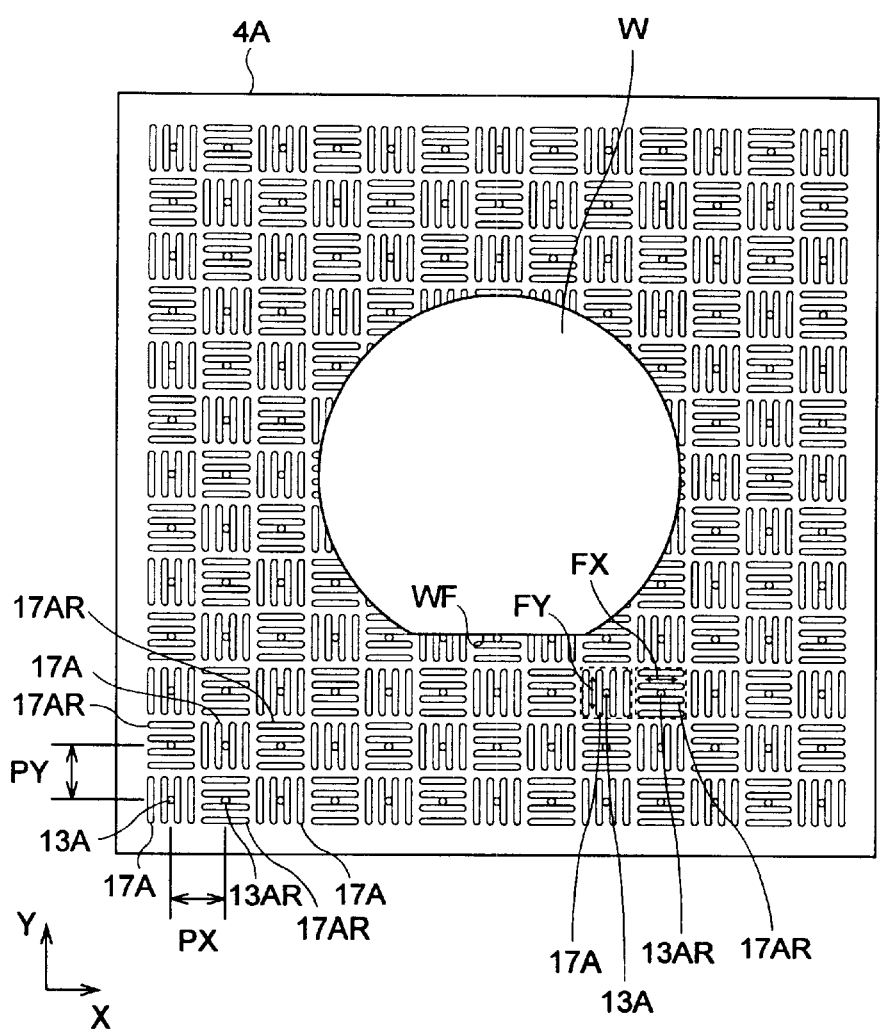
FIG. 9 is a plan view of a driving base 4A of the projecting/exposing apparatus according to a second embodiment of the present invention.

FIG. 9 is a plan view of a driving base 4A of this embodiment. In FIG. 9, the driving units 17A and 17AR are alternately arranged in the driving base 4A at the pitch PX in the X-direction and at the pitch PY in the Y-direction. The constitution of the driving units 17A, 17AR is substantially the same as the constitution in the first embodiment. The compressed air is blown off from the air feeding holes 13A, 13AR in the driving units 17A, 17AR so that the wafer W is levitated by the compressed air. In such a manner, in this embodiment, a single wafer W alone is levitated over the driving base 4A. Moreover, the driving units 17A, 17AR can generate the electrostatic attraction force acting on the wafer W and can keep the gap to the wafer W at a desired value without contact with the wafer W. Furthermore, the driving units 17A and 17AR generate the driving force (the Lorentz force) FY in the Y-direction and the driving force (the Lorentz force) FX in the X-direction to the wafer W without contact with the wafer W, and the wafer W is moved and rotated in the X-direction and Y-direction by the combination of these driving forces FY, FX.

The mechanism for measuring the position of the wafer W of this embodiment in the XY plane is also incorporated in the driving units 17A, 17AR.

Figure 10:
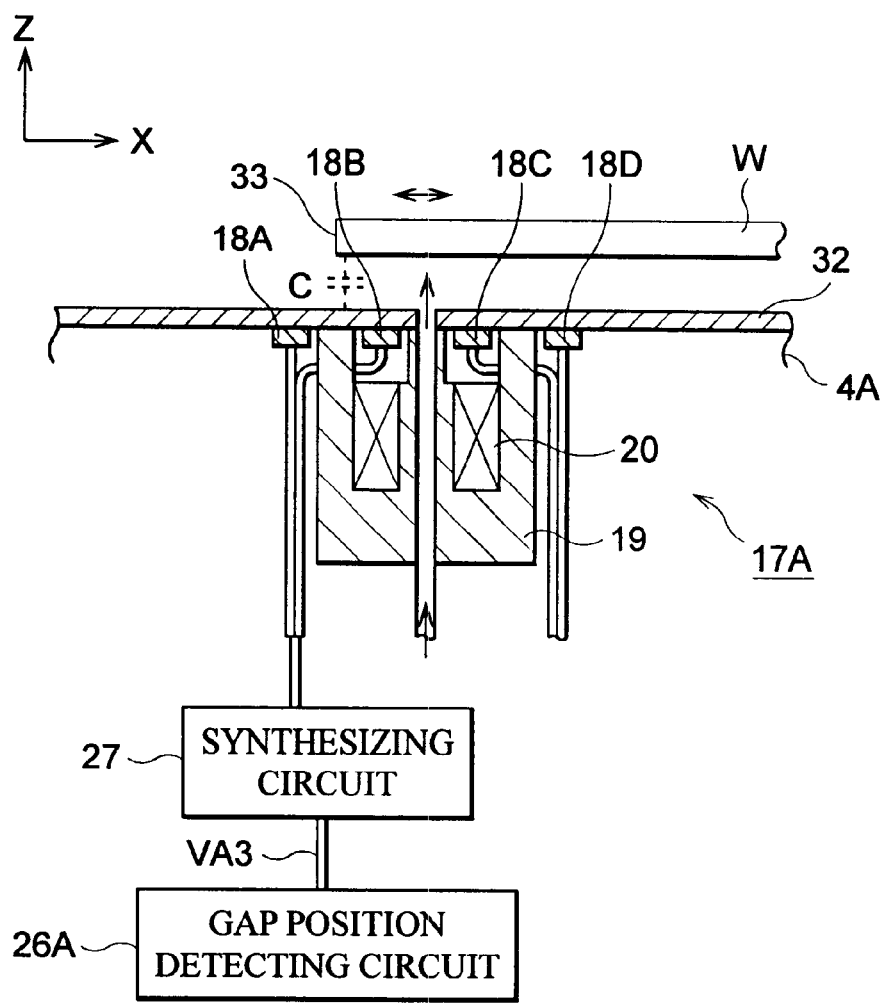
FIG. 10 is a cross sectional view of the driving unit 17A for use in the second embodiment.

FIG. 10 is typically a cross sectional view of a single driving unit 17A. Although the driving circuit of the driving unit 17A of FIG. 10 is substantially the same as the driving circuit 22A of FIG. 5, the gap detecting circuit 26 of FIG. 5 is replaced by a gap position detecting circuit 26A of FIG. 10. This gap position detecting circuit 26A also supplies the alternating-current voltage VA3 of the high frequency f2 to the electrodes 18A, 18B of the driving unit 17A through the synthesizing circuit 27 so as to thereby detect the capacity C of the capacitor generated in response to the gap between the upper plate 32 of the driving base 4A and the bottom surface of the wafer W. Then, when the wafer W is located over the driving unit 17A, that is, when the capacity C is slightly deviated from a predetermined reference value, the gap position detecting circuit 26A detects the gap to the wafer W in accordance with the change in the capacity C and supplies the detection result to the controller 23 of FIG. 5.

On the other hand, when the wafer W is moved in the X-direction and thus an edge 33 of the wafer W crosses over the electrodes 18A, 18B, the capacity C detected by the gap position detecting circuit 26A is considerably changed. The gap position detecting circuit 26A detects the amount of shift of the position of the edge 33 of the wafer W in the X-direction (where a reference point is set at an intermediate point between the electrodes 18A and 18B, for example) in accordance with the change in the capacity C and provides this detection result to the main control system 9 through the controller 23 of FIG. 5. Then, the main control system 9 calculates the position of the wafer W in the X-direction and Y-direction and the angle of rotation from the amount of shift of the position of the edge of the wafer W in the X-direction and Y-direction detected by the gap position detecting circuits 26A attached to the driving units 17A, 17AR of FIG. 9. In accordance with this result, the wafer W is positioned through the driving units 17A, 17AR without contact with the wafer W. The other constitution is the same as the constitution of the first embodiment.

In such a manner, in this embodiment, since the electrodes 18A–18D of the driving units 17A, 17AR are also used as an electrostatic capacity type edge sensor, the displacement including the expansion/contraction (deformation) of the wafer W is detected without contact with the wafer W, and the position of a single wafer W alone can be thus controlled in accordance with this detection.

An another embodiment of the present invention will be described below with reference to FIG. 11. The wafer is levitated by blowing off the compressed air on the rear surface of the wafer in the above-described embodiments, while the wafer (or the holding body) is levitated by upwardly attracting it in this embodiment. The portions corresponding to the portions shown in FIGS. 1–3 have the same reference numerals in FIG. 11, and the detailed description of the corresponding portions is omitted.

Figure 11:
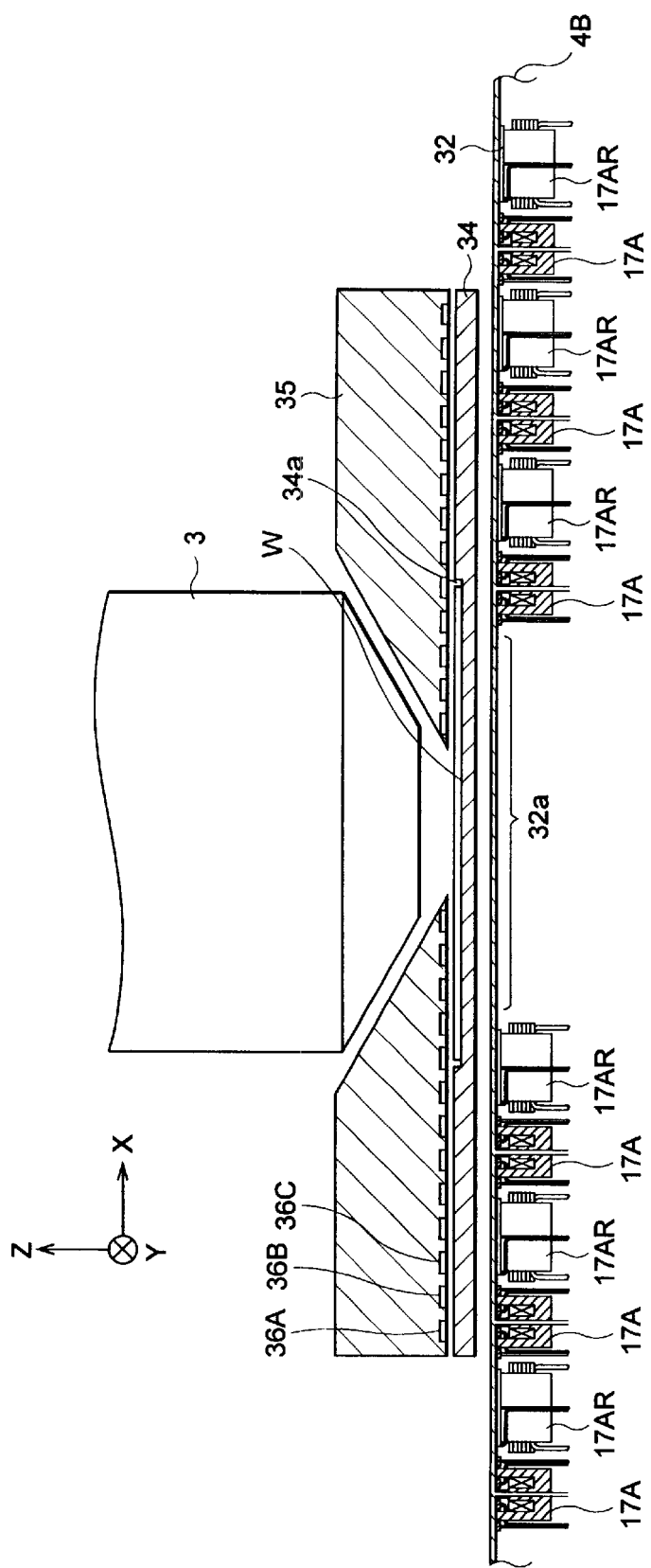
FIG. 11 is a partial cross sectional view of the projecting/exposing apparatus according to a third embodiment of the present invention.

FIG. 11 partially shows the projecting/exposing apparatus of this embodiment. In FIG. 11, the driving units 17A, 17AR are alternately arranged on the bottom of the upper plate 32 of a driving base 43 at a predetermined pitch in the X-direction and Y-direction. It should be noted that the driving units 17A, 17AR are not arranged in a predetermined-sized region 32a including the exposure field of the projection optical system 3 in this embodiment. Although the constitution of the driving units 17A, 17AR of this embodiment is substantially the same as driving unit 17A of FIG. 5, there is provided an additional function for detecting the displacement of the edge of an overcrossing moving body such as the embodiment shown in FIG. 10. Since the driving units 17A, 17AR of this embodiment do not need to blow off the compressed air for levitating the wafer W, the air supply source 15, the flow control valve 14 and the air feeding pipe 16 of FIG. 2 are not provided.

A substantially rectangular plate-shaped movable plate 34 is levitated over the driving base 43. The wafer w is placed in a concavity 34a on the upper surface of the movable plate 34. The movable plate 34 is made of the metallic plate or the electric conductive material such as the conductive ceramics, for example. In this embodiment, the movable plate 34 is driven in the XY plane without contact therewith by the driving units 17A, 17AR in the driving base 4B. At this time, the displacement of the edge of the movable plate 34 is also detected by the edge displacement detecting function of the driving units 17A, 17AR, so that the movable plate 34 is positioned in accordance with this detection result.

In order to levitate the movable plate 34 and the wafer W, a mounting frame 35, which has the bottom surface for covering most of the region where the movable plate 34 is moved, is fixed on the lower side surface of the projection optical system 3 of FIG. 11. Many pairs of same attracting electrodes 36A, 36B, 36C, . . . are fixed on the bottom surface of the mounting frame 35 at a predetermined pitch in the X-direction and Y-direction. For example, a pair of attracting electrodes 36A comprises two electrodes which are narrow long in the Y-direction and are arranged so that a predetermined space may be provided in the X-direction. A predetermined direct-current voltage is applied to the pairs of attracting electrodes 36A, 36B, 36C, . . . from a power source in the main control system (not shown), whereby the electrostatic attraction force is generated between the pairs of attracting electrodes 36A, 36B, 36C, . . . and the movable plate 34 and the wafer W, so that the movable plate 34 and the wafer W are attracted upward (in the direction of +Z) and levitated. At this time, the electrostatic attraction force is also generated between the wafer W and the movable plate 34, so that the wafer W is thus held in the concavity 34a on the movable plate 34 by the electrostatic attraction force. The other constitution is the same as the constitution of the projecting/exposing apparatus shown in FIG. 1.

In this embodiment, the movable plate 34 and the wafer W are upwardly attracted toward the mounting frame 35 by the electrostatic attraction force. Thus, by controlling the electrostatic attraction force which is generated in the direction of −Z by the driving units 17A, 17AR in the driving base 4B, the height and inclined angle of the movable plate 34 can be controlled so that they may be in a desired state. However, since there is provided no pair of attracting electrodes in the region transmitting the exposing light from the projection optical system 3, there is a possibility that the movable plate 34 and the wafer W are downward deflected in this region without measures. Therefore, a pair of attracting electrodes, which is arranged near the exposure field of the projection optical system 3 among the pairs of attracting electrodes 36A, 36B, 36C, . . . of this embodiment, gives the wafer W and the movable plate 34 such a moment (the distance to the center×the force) that the wafer Wand the movable plate 34 are upwardly attracted at the center of the exposure field. Thus, the wafer W is flatly held at all times.

In this embodiment, although the driving units 17A, 17AR are not disposed in the region 32a near the exposure field of the projection optical system 3 in the driving base 4B, since the region around the bottom surface of the movable plate 34 is always located over any ones of the driving units 17A, 17AR, the wafer W can be always positioned through the movable plate 34 at highspeed with high precision. In such a constitution in which the driving units 17A, 17AR are not disposed in the region within a predetermined range including the exposure field, that is, near the lower surface of the wafer W, the unit for generating a variable magnetic field near the lower surface of the water W and a magnetic field generating material are not arranged.

Thus, even if the exposure is performed by the use of an electron ray, an orbit of the electron ray is not changed. Therefore, a contactless driving mechanism as shown in FIG. 11 is also suitable for an electron beam exposing apparatus.

Although the above-mentioned embodiments are the application of the present invention to a full wafer exposure type projecting/exposing apparatus, the present invention may be applied to a scan/exposure type projecting/exposing apparatus such as a step-and-scan system for transferring the reticle on the wafer by scanning the reticle and the wafer in synchronization with the projection optical system. The present invention may be also applied to a proximity type exposing apparatus. Furthermore, a positioning apparatus of the present invention is applicable to not only the exposing apparatus but also other apparatuses such as a machine tool. In such a manner, the present invention is not limited to the above-described embodiments, and various constitutions can be made without departing from the subject matter of the present invention.

According to a above embodiment of the present invention, a plate-shaped article (a semiconductor wafer or the like) and a plate-shaped holding body are levitated over a base, and a driving force of Lorentz force is generated to the levitated article to be driven, whereby the article is positioned without contact therewith. Therefore, since the article to be driven can be miniaturized and lightened, the plate-shaped article can be advantageously positioned at high speed with high precision by the use of a unit which is small-sized and generates little heat. More advantageously, even if a contaminant or the like adheres on a rear surface of the plate-shaped article, since the article does not come into contact with the base, the article is not deformed. Furthermore, no contact results in no contaminant.

When a levitating unit comprises gas feeding units for emitting compressed gas from an opening formed on the base, a levitating force can be substantially constantly applied onto a bottom surface of the article to be driven at all times. When the levitating unit comprises a pair of attracting electrodes arranged over the plate-shaped article and the plate-shaped holding body, a constitution can be simplified on the side of the base.

When a current generating section has a plurality of electrodes arranged on a front surface of the base and a predetermined driving voltage is applied between a pair of adjacent electrodes so that a current is flowed between regions opposite to a pair of electrodes, the current can be contactlessly generated. Furthermore, when a magnetic field generating section is composed of a magnetic field generating material disposed between a pair of adjacent electrodes, a magnetic field can be easily generated perpendicularly to the current.

Moreover, when a distance to the rear surface of a substrate is measured in accordance with a change in an electrostatic capacity caused due to the change in the distance from the front surface of the electrode for generating the current to the substrate, it is not necessary to arrange another gap sensor or the like, and thus the constitution can be simplified.

Furthermore, a first displacement measuring unit is arranged so that it may face to a side surface of the plate-shaped holding body levitated by the levitating unit, and it is the measuring unit for measuring a displacement in at least three positions on the side surface of the plate-shaped holding body. A second displacement measuring unit is arranged so that it may face to an outer peripheral surface of the plate-shaped article, and it is the measuring unit for measuring the displacement in at least three positions on the outer peripheral surface of the plate-shaped article. There is also provided a height measuring unit which is arranged so that it may face to the front or rear surface of the plate-shaped holding body and the plate-shaped article and measures the distance to the front or rear surface of the plate-shaped holding body and the plate-shaped article. In such a case, the displacement of six degrees of freedom of the plate-shaped article can be easily measured.

In this case, when the first displacement measuring unit comprises a laser interferometer for emitting measuring light beams onto at least three positions on the side surface of the plate-shaped holding body levitated by the levitating unit, the displacement of the plate-shaped holding body can be measured without contact with the body with high precision over a wide range. When the second displacement measuring unit comprises a plurality of gap sensors for sensing a gap between an inner wall of a through hole of the plate-shaped holding body and the outer peripheral surface of the plate-shaped article, a relative displacement of the plate-shaped article to the plate-shaped holding body can be easily measured with high precision.

When there is further provided an attraction force generating unit for attracting the plate-shaped holding body and the plate-shaped article toward the base, the height of the plate-shaped article can be positioned with high precision.

In this case, when the attraction force generating unit applies a predetermined voltage between a pair of adjacent electrodes for generating the current so as to thereby generate an electrostatic attraction force for attracting the plate-shaped article or the like toward the base, the electrodes can be also used as the current generating section and the attraction force generating unit. Thus, the height of the plate-shaped article or the like can be positioned by a very simple constitution.

Furthermore, when the voltage applied between a pair of electrodes for generating the current is adjusted for each set so as to thereby correct a deformation of the plate-shaped article, a flatness of the plate-shaped article can be improved without enlarging the apparatus.

Moreover, according to a second positioning apparatus of the present invention, since the plate-shaped article (the semiconductor wafer or the like) alone is driven by the Lorentz force without contact therewith, the article to be driven is minimum-sized and lightest in weight, and thus the plate-shaped article can be positioned at very high speed with higher precision.

According to an exposing apparatus of the present invention, since the semiconductor wafer is positioned at high speed without contact therewith by the use of the positioning apparatus of the present invention, throughput can be improved in an exposing process. Furthermore, since the contaminant on the rear surface of the semiconductor wafer does not cause the deformation of the semiconductor wafer and no contact with the semiconductor wafer results in no contaminant, a yield of a semiconductor integrated circuit or the like to be manufactured can be improved.

More another embodiment of the embodiment of the present invention will be described below with reference to the accompanying drawings. This embodiment is the application of the present invention to a semiconductor wafer holding portion of the projecting/exposing apparatus.

Figure 12:
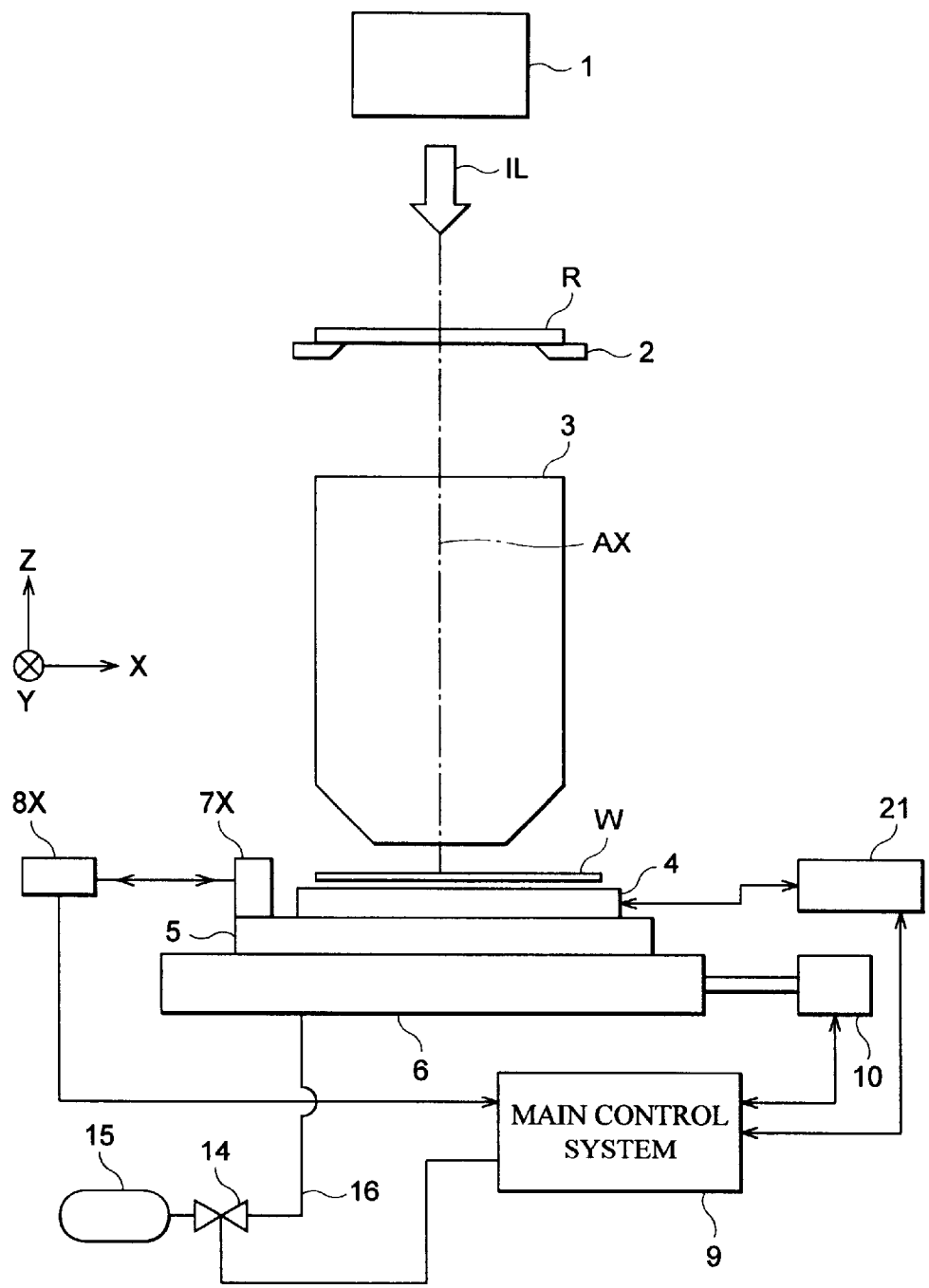
FIG. 12 shows a schematic constitution of the projecting/exposing apparatus of an embodiment of the present invention.

FIG. 12 shows a schematic constitution of the projecting/exposing apparatus of this embodiment. The elements having the same reference numerals/symbols in FIG. 1 are the same portions in FIG. 12, and the description is thus omitted.

That is, in the embodiment shown in FIG. 12, there are additionally provided a Z stage 5 capable of positioning a wafer holder 40 in the Z-direction and a driving stage 10 for driving the Z stage 5. The wafer holder 40 is fixed, and the Z stage 5 is mounted on an XY stage 6 capable of moving in the X-direction and Y-direction. An X-axial movable mirror 7X for reflecting the laser beam emitted from the laser interferometer 8X is fixed on an upper end in the direction of −X on the Z stage 5. A Y-axial movable mirror 7Y for reflecting the laser beams emitted from the two parallel-arranged laser interferometers 8YA, 8YB (see FIG. 13A) is also fixed on the upper end in the direction of +Y on the Z stage 5. The laser interferometers 8X, 8YA, 8YB measure the displacements of the corresponding movable mirrors at the resolution of about 0.001–0.01 μm, for example. Then, they output the result of measurement to the main control system 9.

In this case, for example, the X-coordinates and the Y-coordinates of the Z stage 5 and the wafer holder 40 are determined from the value measured by the laser interferometer 8X and the average value of the values measured by the laser interferometers 8YA, 8YB, respectively The angle of rotation of the Z stage 5 (the wafer holder 40) is determined from the difference between the values measured by the two laser interferometers 8YA, 8YE on the Y-axis. In accordance with the information on the position of the Z stage 5 (the wafer W) obtained from the values measured by the laser interferometers 8X, 8YA, 8YB, the main control system 9 controls the operation for positioning the XY stage 6 through a feed-screw wafer stage driving section 10 including a driving motor, for example.

On the side surface of the projection optical system 3, arranged is the oblique-incidence focal point position detecting system (not shown) for projecting the slit image or the like on the front surface of the wafer W and for detecting the amount of defocus of the wafer W from the-amount of vertical shift of the slit image reformed by the light reflected from the wafer W. In accordance with the output or the like from this focal point position detecting system, the main control system 9 controls the position of the Z stage 5 (the wafer W) by the auto-focus method. As described below, since the wafer holder 40 of this embodiment is also provided with the function for setting the distance to the wafer W at a desired value, the auto-focus and auto-leveling can be also performed through the wafer holder 40.

The wafer stage comprises the Z stage 5, the XY stage 6, the movable mirrors 7X, 7Y and the wafer stage driving section 10. In this embodiment, as described below, there is also provided a function for slightly moving the position of the wafer W without contact with the wafer holder 40 and for positioning the wafer W with high precision. During the exposure, when the exposure is completed in a certain shot region on the wafer W, the wafer W is stepped through the XY stage 6 at high speed, and the subsequent shot region is moved to the exposure field of the projection optical system 3. Then, the wafer W is positioned through the wafer holder 40 with high precision, and the pattern image on the reticle R is projected/exposed to that shot region. The above operation is repeated by the step-and-repeat method, so that each shot region on the wafer W is exposed to the light.

As described above, the wafer W of this embodiment is held so that they may be levitated at a predetermined distance over the wafer holder 40 without contact therewith. Furthermore, although the wafer stage of the projecting/ exposing apparatus of this embodiment allows the Z stage 5 (the wafer W) to be roughly moved at high speed, this water stage itself is not provided with the slight moving stage. Although the XY stage 6 in the wafer stage can be used as the slight moving stage, this is required to position the moving body including the Z stage 5, which may cause a response speed to be deteriorated. Therefore, in this embodiment, the wafer holder 40 is also provided with the function of the slight moving stage. The main control system 9 controls the operation of the wafer holder 40 through the wafer holder driving section 21. The mechanisms for holding/slightly moving the wafer W without contact with the wafer by the wafer holder 40 will be described below.

Figure 13A:
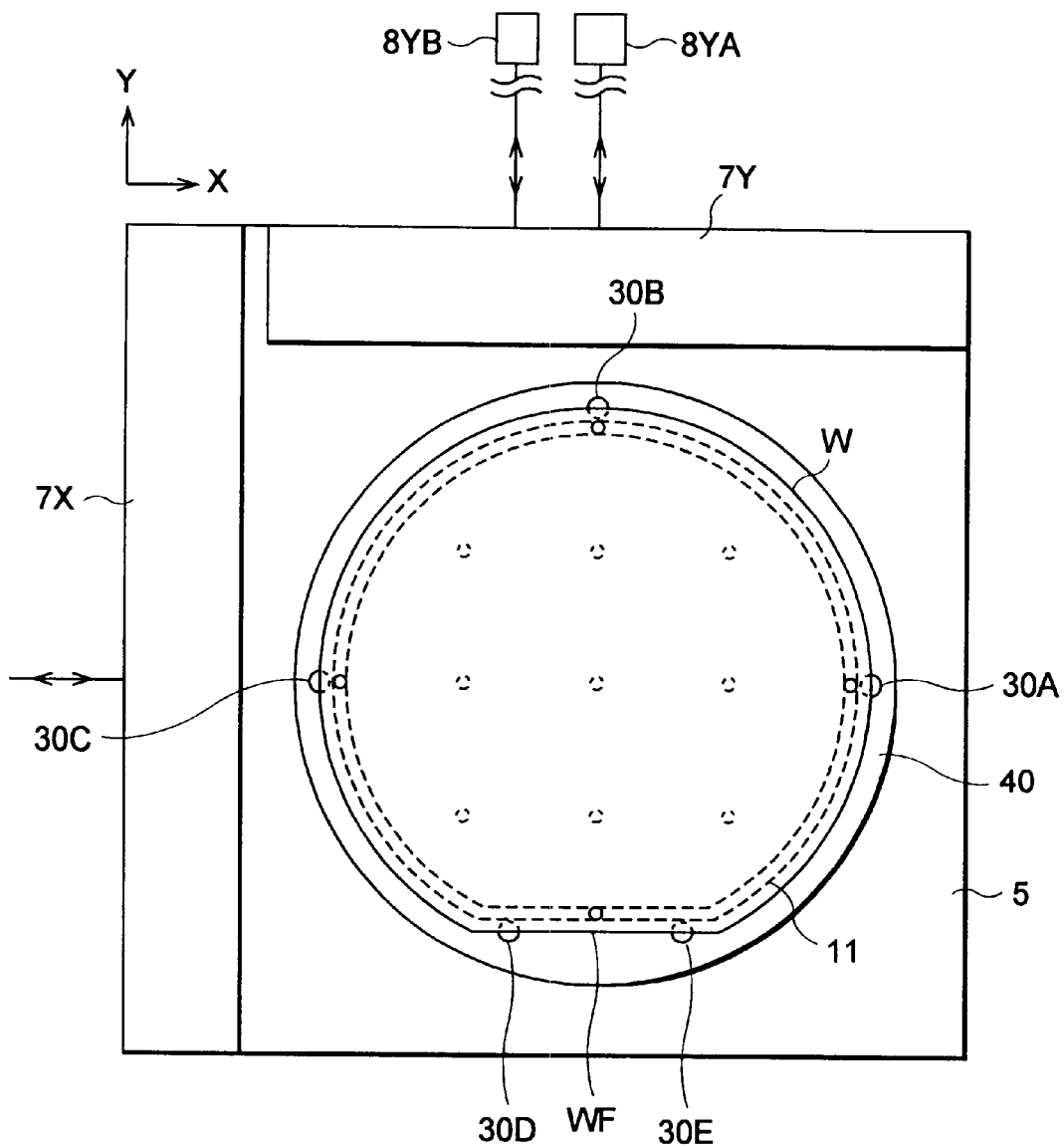
FIG. 13A is a plan view of a Z stage 5 and a wafer holder 40 of the projecting/exposing apparatus shown in FIG. 12.
Figure 13B:
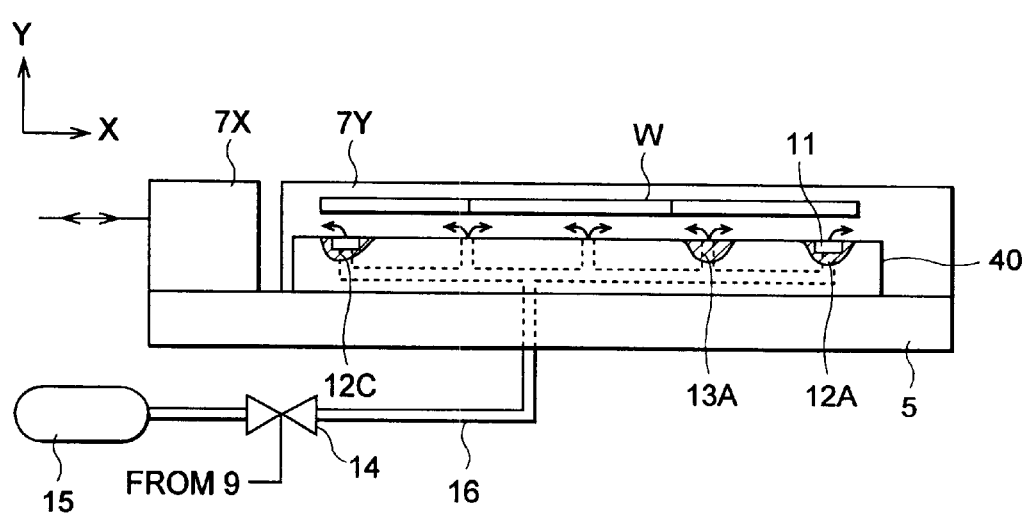
FIG. 13B is a partially cutaway front view of the Z stage 5 and the wafer holder 40.

In the first place, FIG. 13A is a plan view of the z stage 5 and the wafer holder 40 shown in FIG. 12. FIG. 13B is a partially cutaway front view of FIG. 13A. As shown in FIGS. 13A and 13B, the circular wafer holder 40 is fixed on the Z stage 5, the wafer W is held so that it may be levitated over the wafer holder 40, and the movable mirrors 7X, 7Y are fixed on the side surface of the wafer holder 40 on the Z stage 5. On the front surface of the wafer holder 40, formed is a looped levitating air feeding groove 11 having substantially the same shape as an outer shape of the wafer W to be held. Since the wafer W of this embodiment is the wafer which is substantially circular and has the orientation flat portion WF in part, a circumference of the levitating air feeding groove 11 is also partially flat. The five electrostatic capacity type edge sensors 30A–30E are also arranged near the bottom of the contour of the wafer W in the region outside the levitating air feeding groove. 11 on the wafer holder 40. The edge sensors 30A–30E detect the amount of displacement in a normal direction of the contour (edge) of the wafer W from a the reference points in the sensors and then supply the detection result to the main control system 9 (see FIG. 5).

In this case, the edge sensors 30D, 30E are arranged so that they may match to both the ends of the orientation flat portion WF on the outer periphery of the wafer W in order to measure the angle of rotation of the wafer W. The three remaining edge sensors 30A–30C are arranged so that they may be spaced at about 90° along the circular-arc outer periphery of the wafer W in order to measure the amount of displacement of the wafer W in the X-direction and the Y-direction. In this embodiment, the edge sensors 30D, 30E are arranged so that they may be adapted for the orientation flat portion WF on the wafer W. On the other hand, when the notch portion is formed on the wafer, the shape of the levitating air feeding groove 11 and the arrangement of the edge sensors 30D, 30E may be changed in such a manner that they are adapted for the notch portion.

Figure 14:
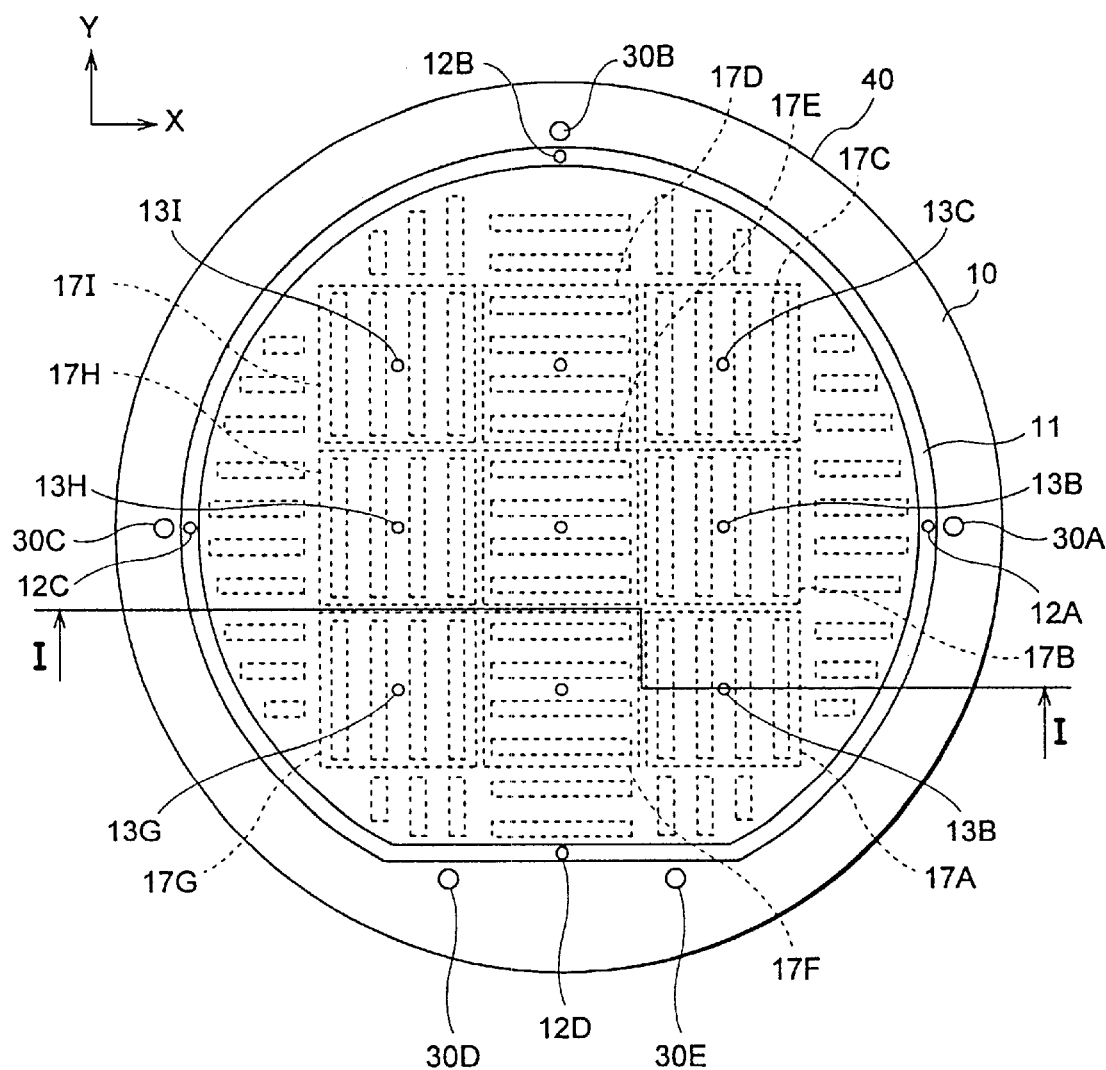
FIG. 14 is a plan view of the wafer holder 40 shown in FIG. 2.

FIG. 14 is an enlarged plan view of the wafer holder 40 shown in FIG. 13A. As shown in FIG. 14, four air feeding holes 12A–12D are disposed in the levitating air feeding groove 11 so that they may be spaced at about 90° Nine air feeding holes 13A, 13B, . . . , 13H, 13I (3-row×3-column) are also disposed in the region surrounded by the levitating air feeding groove 11. As shown in FIG. 14, these air feeding holes 12A–12D and 13A–13I are connected to the end of the air feeding pipe 16 in the wafer holder 40. The compressed air (the compressed nitrogen gas or the like is also possible) in the air supply source 15 is emitted from the air feeding holes 12A–12D on the front surface of the wafer holder 40 through the air feeding pipe 16, whereby the compressed air layer is formed along the looped levitating-air feeding groove 11, so that the wafer W is levitated by this compressed air layer. Since the compressed air is also emitted from the air feeding holes 13A–13I in the levitating air feeding groove 11, the center of the wafer W is not deflect downward. At this time, the main control system 9 controls the flow rate of the compressed air passing through the flow control valve 14, whereby the amount of levitation of the wafer W can be controlled to some extent. As described below, since a plurality of driving units capable of attracting the wafer W and of displacing the wafer W in a predetermined direction are also incorporated in the wafer holder 40 of this embodiment, the position of the wafer W can be exactly controlled in the Z-direction and the curvature or the like of the wafer W can be also corrected through these driving units.

That is, as shown in FIG. 14, the nine driving units 17A, 17B, . . . , 17H, 17I are incorporated in the region surrounded by the levitating air feeding groove 11 on the wafer holder 40 so that three rows and three columns may be arranged in the X-direction and the Y-direction, respectively and the driving units may have the same constitution. Since the directions (the angles of rotation) of the driving units 17A–17I are different from one another, the directions of the generated Lorentz forces are also different from one another as described below. Specifically, the three driving units 17A–17C in the first row and three driving units 17G–17I in the third row arranged parallel to the Y-axis have the same direction. The three driving units 17D–17F in the second row arranged parallel to the Y-axis at the center are rotated by 90° with respect to the driving units in the other two rows.

Herein, an enlarged cross sectional view taken on line 1—1 of FIG. 14 is the same as FIG. 4 showing the above-described embodiment. Accordingly, since the mechanism is also the same, the description is omitted.

The following description is provided for an example of the operation when the wafer W is exposed by the projecting/exposing apparatus of this embodiment. In the first place, in FIG. 12, when the wafer W is supplied onto the wafer holder 40 from the wafer loader system (not shown), the main control system 9 allows the compressed air to be blown off from the air feeding holes 12A–12D, 13A–13I of the wafer holder 40 at the standard flow rate predefined by the flow control valve 14. Thus, the wafer W is levitated and held over the wafer holder 40. After that, the main control system 9 corrects the curvature of the wafer W. Since this correction of the wafer curvature is performed in the same manner as the above-described embodiment shown in FIG. 7, the description is omitted. After that, the wafer holder 40 is stepped/driven through the XY stage 6 of FIG. 12, and the shot region on the wafer W to be exposed is roughly positioned in the exposure field of the projection optical system 3. Then, the wafer W is slightly moved without contact therewith through the Lorentz force by the wafer holder 40, whereby the wafer W is finally positioned.

Thus, when the wafer W is roughly positioned, the main control system 9 calculates the amounts ΔX, ΔY of shift of the position of the shot region on the wafer W to the exposing position in the X-direction and Y-direction and the amount Δθ of shift of the angle of rotation in accordance with the values measured by the laser interferometers 8X, 8YA, 8YE and the values measured by the edge sensors 30A–30E of FIG. 13A.

Figure 15A:
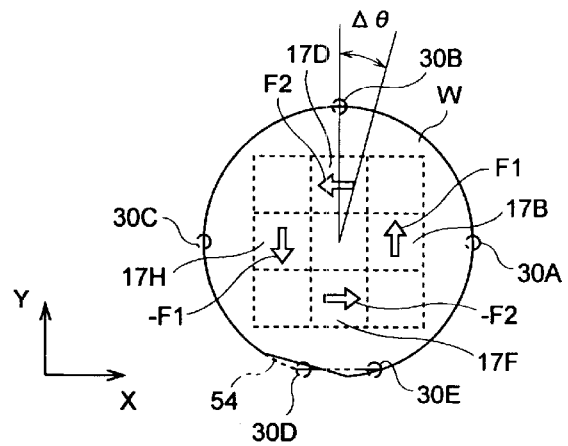
FIG. 15A–15C illustrate the correction of an angle of rotation and an amount of shift in the X-direction and Y-direction of the wafer W by the use of the driving unit.

Next, in order to firstly correct the amount Δθ of shift of the angle of rotation (assuming it as the amount of clockwise shift), as shown in FIG. 15A, the main control system 9 supplies the amount of displacement to the controllers of the ±X-directional driving units 17B, 17H and the ±Y-directional driving units 17D, 17F on the bottom of the wafer W so that the amount Δθ of shift may be canceled. In response to this operation, the counterclockwise Lorentz forces F1, F2, −F1, −F2 act on the wafer W from the driving units 17B, 17D, 17H, 17F, respectively, so that the wafer W is rotated by −Δθ as shown by a two-dotted line 54. At this time, since the angle of rotation of the wafer W is monitored in accordance with the values measured by the edge sensors 30D and 30E, the angle of rotation of the wafer W is exactly corrected in the closed loop in accordance with these measured values.

Figure 15B:
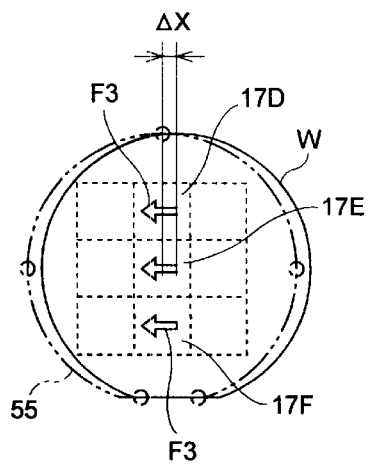
Figure 15C:
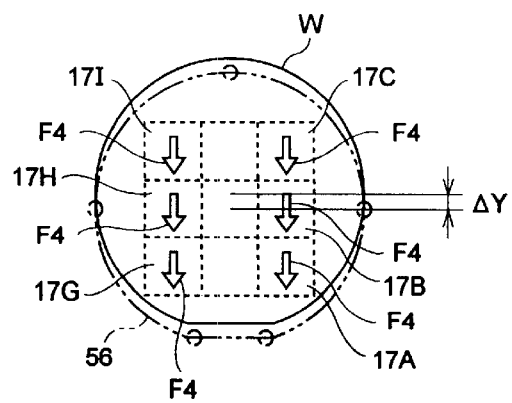

Next, in order to correct the amount ΔX of shift of the position in the X-direction (assuming it as the amount of shift in the direction of +X), as shown in FIG. 15B, the main control system 9 supplies the amount of displacement to the controllers of the driving units 17D–17F at the center on the bottom of the wafer W so that the amount ΔX of shift may be canceled. In response to this operation, the Lorentz force F3 acts on the wafer W from the driving units 17D–17F in the direction of −X, so that the wafer W is displaced by −ΔX as shown by a two-dotted line 55. In the same manner, in order to correct the amount ΔY of shift of the position in the Y-direction (assuming it as the amount of shift in the direction of +Y), as shown in FIG. 15C, the main control system 9 supplies the amount of displacement to the controllers of the driving units 17A–17C and 17G–17I on the left and right sides on the bottom of the wafer W so that the amount ΔY of shift may be canceled. In response to this operation, the Lorentz force F4 acts on the wafer W from the driving units 17A–17C, 17G–17I in the direction of −Y, so that the wafer W is displaced by—Y as shown by a two-dotted line 56. At this time, since the X-directional/Y-directional displacements of the wafer W are also monitored by the edge sensors 30A–30C or the like, the position of the wafer W is exactly corrected in the closed loop in accordance with this monitor.

When the position of the wafer W is thus set at a target position, the pattern image of the reticle R is exposed onto the shot region. The exposure is also performed in the other shot regions in the same manner. In this case, since there is provided no slight moving stage for supporting the Z stage 5 of FIG. 12 in this embodiment, the moving body to be driven by the XY stage 6 is small-sized and light in weight. It is therefore possible to increase a stepping speed of the XY stage 6.

Furthermore, since the wafer W is levitated and held without contact therewith over the wafer holder 40 of this embodiment, even if the contaminant such as the residue of the resist adheres on the rear surface of the wafer W, the wafer W is not curved. Moreover, since the curvature or the like of the wafer W can be corrected by controlling the electrostatic attraction force by the driving units 17A–17I, the wafer W is flatly held during the exposure. Therefore, since the reticle image can be transferred on each shot region on the wafer W with high resolution, the yield of the semiconductor integrated circuit to be finally manufactured is improved. Furthermore, in this embodiment, since the wafer W is displaced through the Lorentz force without contact therewith by the driving units 17A–171 in the wafer holder 40 so that the wafer W is finally positioned, the wafer holder 40 can be considered to also serve as the slight moving stage. In addition, since the Lorentz force can be generated at electrically high response speed by the driving units 17A–17I and the edge sensors 30A–30E for sensing the displacement of the wafer W are provided, the wafer W can be slightly moved at very high speed with higher precision by means of the smaller/lighter mechanism than the prior-art mechanism.

Furthermore, in this embodiment, since the driving units 17A–17I can individually control the electrostatic attract ion force acting on the wafer W and can individually measure the gap to the wafer W, even if the wafer W is locally deformed, the electrostatic attraction force is controlled in the driving unit on the bottom of the deformed portion, whereby the local deformation can be also easily corrected.

More specifically, this is effective for the exposure on the large-sized wafer which is prone to the local deformation.

Another embodiment of the present invention will be described below with reference to FIG. 16. Although the wafer is levitated by blowing off the compressed air on the rear surface of the wafer in the above-described embodiments, the wafer is levitated by upwardly attracting the wafer in this embodiment. The portions corresponding to the portions shown in FIG. 1 have the same reference numerals in FIG. 16 and the detailed description of the corresponding portions is omitted.

Figure 16:
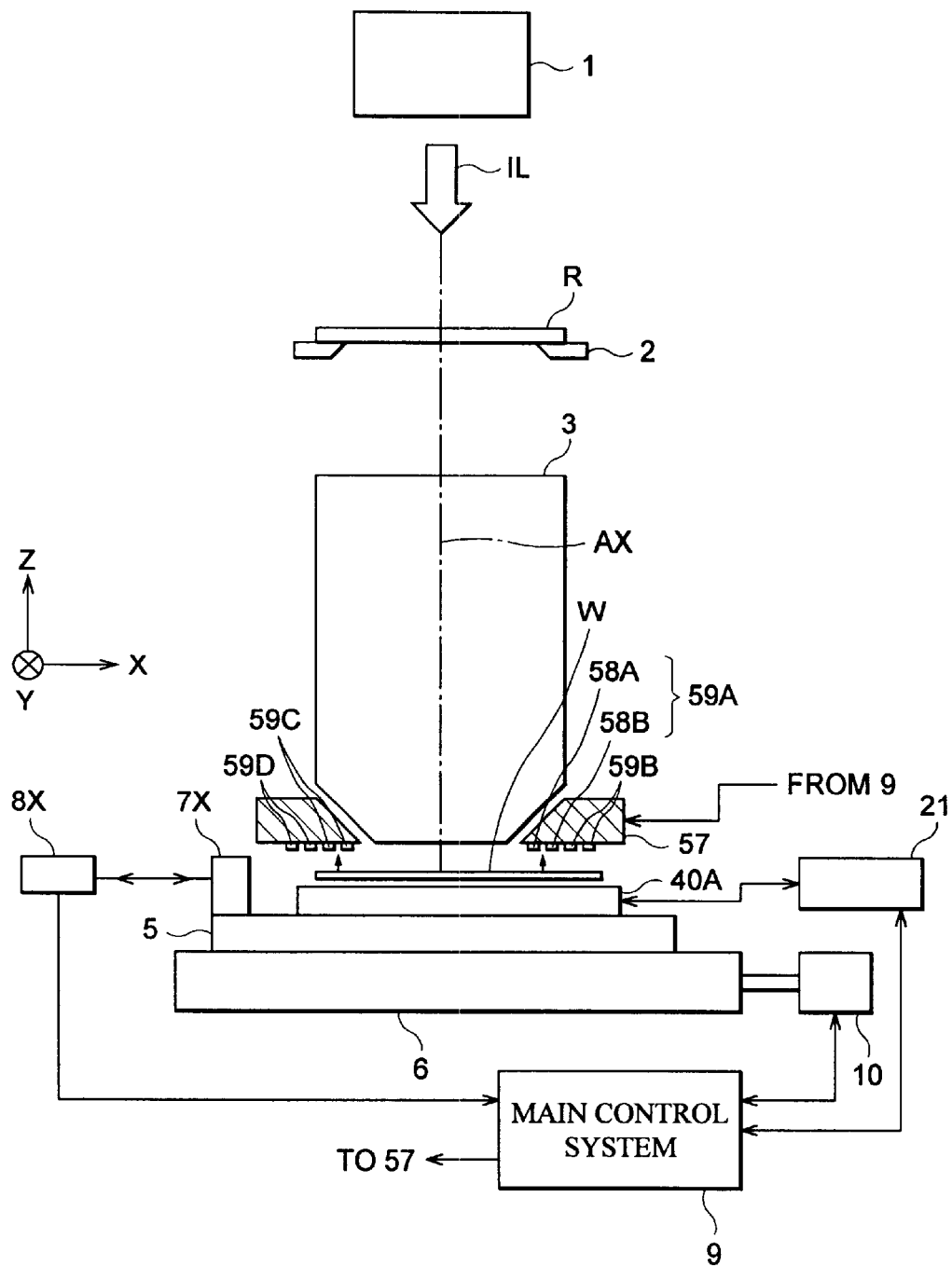
FIG. 16 shows the schematic constitution of the projecting/exposing apparatus of another embodiment of the present invention.
Figure 17:
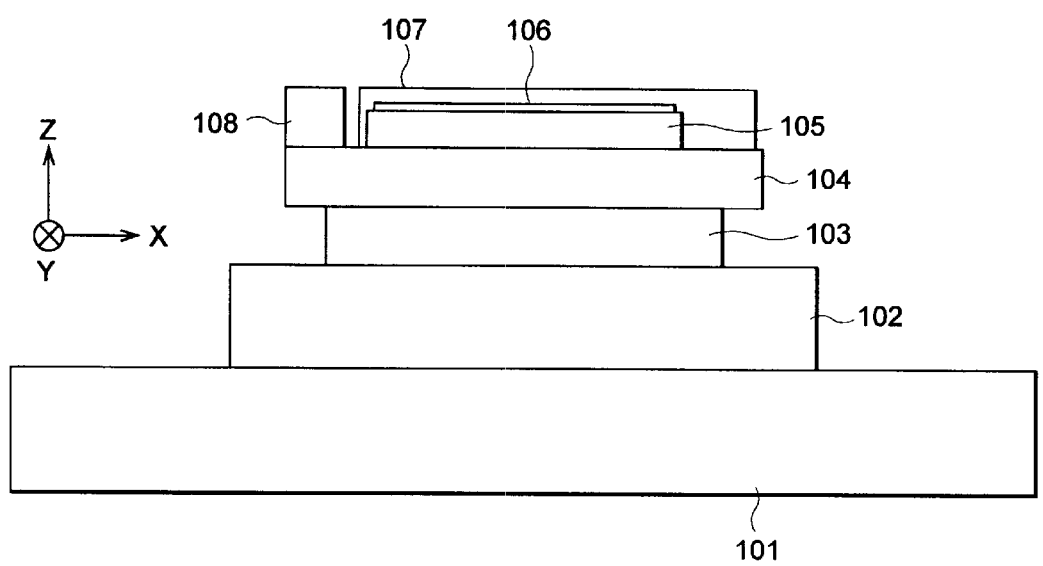
FIG. 17 shows the constitution of an example of a wafer stage of the prior-art exposing apparatus.
Figure 18:
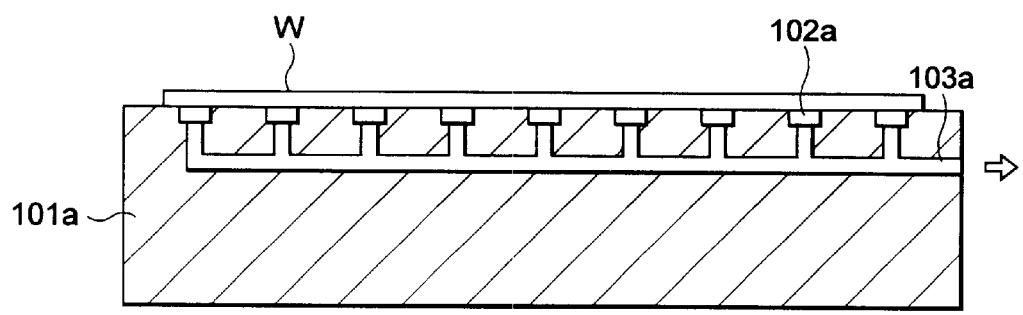
FIG. 18 is a cross sectional view of an example of the prior-art wafer holder.
Figure 19:
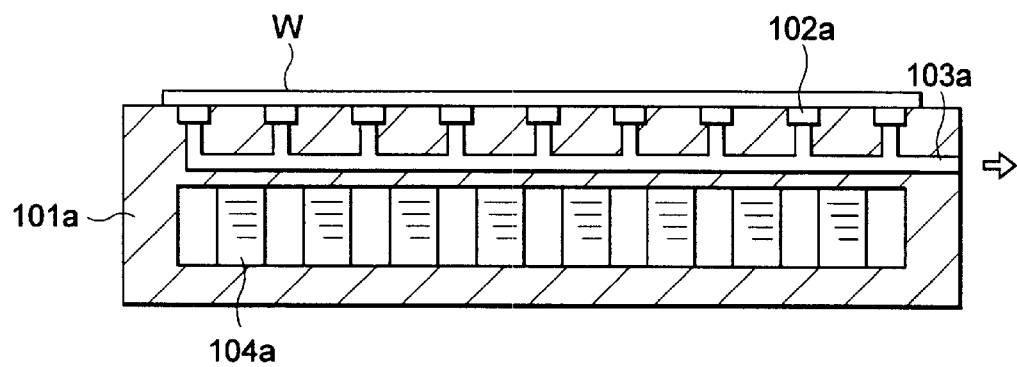
FIG. 19 is a cross sectional view of another example of the prior-art wafer holder.
Figure 20:
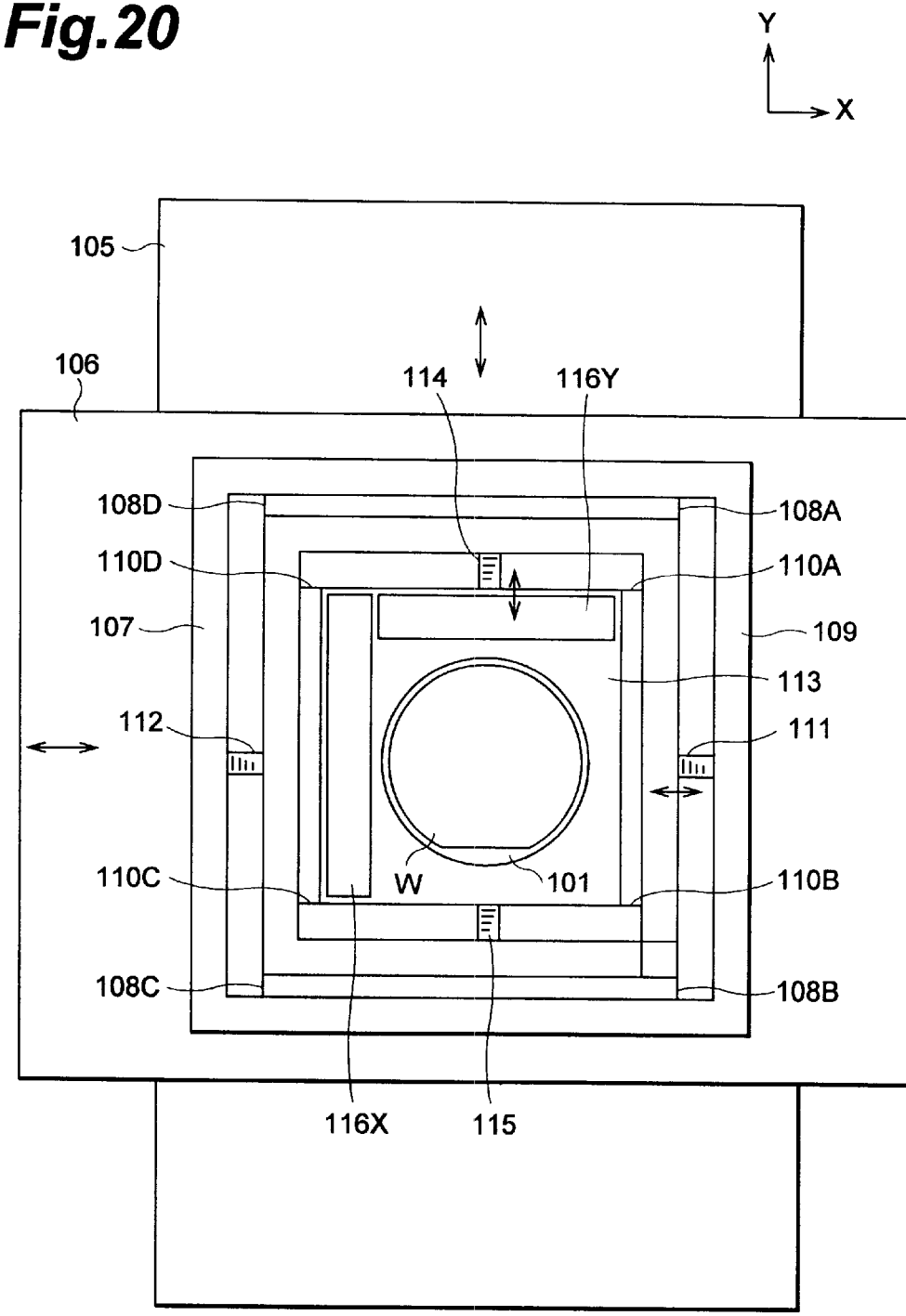
FIG. 20 is a plan view of an example of the wafer stage of the prior-art exposing apparatus.

FIG. 16 shows the projecting/exposing apparatus of this embodiment. In FIG. 16, a wafer holder 40A is fixed on the Z stage 5, and the wafer W is held so that it may be levitated at a predetermined distance over the wafer holder 40A. Although the wafer holder 40A of this embodiment has the substantially same structure as the wafer holder 40 of FIG. 12, the wafer holder 40A differs from the wafer holder 40 in that the wafer holder 40A does not have the mechanism for blowing off the compressed air. That is, the driving units 17A–17I are incorporated in the wafer holder 40A in the same manner as shown in FIG. 14 (it should be noted that the air feeding holes 13A–13I are not disposed in the wafer holder 40A). A mounting frame 57, which has the bottom surface for covering almost all the region where the wafer W is moved, is fixed on the lower side surface of the projection optical system 3 of FIG. 16. Many pairs of same attracting electrodes 59A, 59B, 59C, 59D, . . . are fixed on the bottom surface of the mounting frame 57 at a predetermined pitch in the X-direction and Y-direction. For example, a pair of attracting electrodes 59A comprises two electrodes 58A and 58B which are composed of the Y-directional narrow long conductive material and are arranged so that a predetermined space may be provided in the X-direction.

A predetermined direct-current voltage is applied between the electrodes 58A and 58B from the power source in the main control system 9. Thereby, since the electrostatic attraction force is generated between a pair of attracting electrodes 59A and the wafer W and the electrostatic attraction force is also generated between the other pairs of attracting electrodes 59B, 59C, . . . and the wafer W in the same manner, the water W is attracted upward (in the direction of +Z) and levitated. The other constitution is the same as the constitution of the projecting/exposing apparatus shown in FIG. 12.

In this embodiment, the wafer W is upwardly attracted toward the mounting frame 57 by the electrostatic attraction force. Thus, by controlling the electrostatic attraction force which is generated in the direction of –Z by the driving units 17A–17I in the wafer holder 40A, the Z-directional position, the curvature or the like of the wafer W can be corrected in the same manner as the embodiment of FIG. 12. Furthermore, even if the wafer holder 40A (the wafer W) is considerably moved in the X-direction and Y-direction by the XY stage 6, the wafer W is upward attracted by any one of the pairs of attracting electrodes 59A, 593, . . . on the bottom of the mounting frame 57. In this embodiment, since it is not necessary to provide the mechanism for blowing off the compressed air on the side of the wafer holder 40A, the mechanism of the wafer holder 40A is simplified. Furthermore, since a piping for the compressed air is not needed, the wafer holder 40A (the wafer W) can be more smoothly positioned.

Although the horizontal displacement of the wafer W to the wafer holders 4, 4A is measured by the use of the electrostatic capacity type edge sensors 30A–30E in the above-mentioned embodiments, the edge sensor is not limited to the electrostatic capacity type one. For example, an optical edge sensor or the like for measuring the displacement of the wafer W in accordance with the change in an amount of light of a detecting light passing through or being reflected by the edge of the wafer W may be used.

Furthermore, in the above-mentioned embodiments, although the constitution is simplified because the electrodes 18A, 18B for generating the driving force are also used as the gap sensor for measuring the gap to the rear surface of the wafer W, another independent gap sensor may be provided. Furthermore, in this embodiment, since there is provided the oblique-incidence focal point position detecting system (not shown) for detecting the position of the front surface of the wafer W in the Z-direction, this focal point position detecting system is adapted so that it can measure on many points, whereby the gap between the rear surface of the wafer W and the wafer holders 4, 4A may be controlled in accordance with this measurement result.

Furthermore, although the above-mentioned embodiments are the application of the present invention to a stepper type projecting/exposing apparatus, the present invention may be applied to a step-and-scan type projecting/exposing apparatus for transferring the reticle on the wafer by scanning the reticle and the wafer in synchronization with the projection optical system. The present invention may be also applied to the proximity type exposing apparatus. Furthermore, the positioning device and the substrate holding apparatus of the present invention are applicable to not only the exposing apparatus but also other apparatuses such as the machine tool. In such a manner, the present invention is not limited to the above-described embodiments, and various constitutions can be made without departing from the subject matter of the present invention.

According to an article positioning apparatus of the present invention, an article is levitated over a base, and a driving force of Lorentz force is generated to the levitated article, whereby the article is positioned without contact therewith. Therefore, the article can be positioned at high speed with high precision. More advantageously, even if a contaminant or the like adheres on a rear surface of the article, since a substrate does not come into contact with the base, even the article which is specifically prone to deformation is not deformed.

When a levitating unit comprises gas feeding units for emitting compressed gas from an opening formed on the base, a levitating force can be substantially constantly applied onto a bottom surface of the substrate at all times. When the levitating unit comprises a pair of attracting electrodes arranged over the substrate and a predetermined voltage is applied between the pair of attracting electrodes so that the substrate is attracted/levitated by an electrostatic attraction force, a constitution can be simplified on the side of the base.

When a current generating section has a plurality of electrodes arranged on a front surface of the base and a predetermined driving voltage is applied between a pair of adjacent electrodes so that a current is flowed between regions on the substrate opposite to the pair of electrodes, the current can be contactlessly generated. Furthermore, when a magnetic field generating section is composed of a magnetic field generating material disposed between the pair of adjacent electrodes, a magnetic field can be easily generated perpendicularly to the current.

Moreover, when a distance to the rear surface of the substrate is measured in accordance with a change in an electrostatic capacity caused due to the change in the distance from the front surface of the electrode for generating the current to the substrate, it is not necessary to arrange another gap sensor or the like, and thus the constitution can be simplified.

Furthermore, when a displacement measuring unit has a plurality of edge sensors and a plurality of gap sensors, for example, the displacement of six degrees of freedom including a translational direction and a direction of rotation of the substrate can be detected. In accordance with this result, the substrate can be positioned with six degrees of freedom.

When there is further provided an attraction force generating unit for attracting the substrate toward the base, a height of the substrate can be positioned with high precision.

In this case, when the attraction force generating unit applies a predetermined voltage between a pair of adjacent electrodes for generating the current so as to thereby generate the electrostatic attraction force for attracting the substrate toward the base, the electrodes can be also used as the current generating section and the attraction force generating unit. Thus, the height of the substrate can be positioned by a very simple constitution.

Furthermore, when the voltage applied between a pair of electrodes for generating the current is adjusted for each set so as to thereby correct the deformation of the substrate, a flatness of the substrate can be improved by the very simple constitution.

Furthermore, according to an exposing apparatus of the present invention, since a mask pattern image can be exposed onto a semiconductor wafer levitated/held by the use of the substrate holding apparatus of the present invention, the semiconductor wafer can be rapidly positioned/held with high precision. Moreover, since the contaminant on the rear surface of the semiconductor wafer does not cause the deformation of the semiconductor wafer, the yield of the semiconductor integrated circuit or the like to be manufactured can be improved. Furthermore, since the semiconductor wafer levitated over the base can be directly driven and positioned without contact therewith, a mechanism such as a slight moving stage for finely adjusting the position of the semiconductor wafer is not needed. Therefore a rough moving stage can be moved at high speed and a heat generated by the rough moving stage can be also suppressed.

Furthermore, according to a positioning device of the present invention, the substrate levitated/held over the base can be positioned at high speed with high precision without contact therewith by the very simple constitution.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A substrate positioning apparatus for positioning an substrate composed of an electric conductive material over a predetermined base, said apparatus comprising:
   levitating units that levitate said substrate over said base;
   driving force generating units including current generating sections that induce a current in said substrate and magnetic field generating sections that generate a magnetic field in a direction perpendicular to said current induced by said current generating sections, wherein said driving force generating units generate a driving force, composed of Lorentz forces, that drives said substrate in a direction perpendicular to said current and said magnetic field; and
   displacement detecting units that detect a displacement of said substrate,
   wherein said substrate is positioned through said driving force generating units in accordance with a result detected by said displacement detecting units.

2. The substrate positioning apparatus according to claim 1, wherein said levitating unit comprises gas feeding units to emit compressed gas from an opening formed on said base.

3. The substrate positioning apparatus according to claim 1, wherein said levitating unit comprises a pair of attracting electrodes arranged over a substrate, and a predetermined voltage is applied between said pair of attracting electrodes, whereby said substrate is attracted and levitated by an electrostatic attraction force.

4. The substrate positioning apparatus according to claim 1, wherein said current generating section has a plurality of electrodes arranged on a front surface of said base, and a predetermined driving voltage is applied between a pair of adjacent electrodes, whereby the current is flowed between regions on an substrate opposite to said pair of electrodes.

5. The substrate positioning apparatus according to claim 4, wherein said magnetic field generating section is composed of magnetic field generating materials disposed between said pair of adjacent electrodes.

6. The substrate positioning apparatus according to claim 4 further comprising:
   an electrostatic capacity detecting unit to detect a change in an electrostatic capacity caused due to the change in a distance from the front surface of said electrodes of said current generating section to a rear surface of said substrate,
   wherein the distance to the rear surface of said substrate is measured in accordance with the result detected by said electrostatic capacity detecting unit.

7. The substrate positioning apparatus according to claim 1, wherein said displacement detecting unit has a plurality of edge sensors arranged so as to correspond to an outer edge of said substrate levitated by said levitating units and a plurality of gap sensors for sensing a gap to the front or rear surface of said substrate.

8. The substrate positioning apparatus according to claim 1 further comprising:
   attraction force generating units to attract said substrate toward said base.

9. The substrate positioning apparatus according to claim 8, wherein said attraction force generating units apply a predetermined voltage between said pair of adjacent electrodes of said current generating section and for generating the electrostatic attraction force for attracting said substrate toward said base.

10. The substrate positioning apparatus according to claim 9, wherein the voltage applied between said pair of adjacent electrodes of said current generating section is adjusted for each set, whereby a deformation of said substrate is corrected.

11. An exposing apparatus comprising an substrate positioning apparatus according to claim 1, said exposing apparatus for levitating/holding a semiconductor wafer coated with a photosensitive material over said substrate positioning apparatus and for exposing a mask pattern image onto said held semiconductor wafer.

12. A positioning device for positioning an article composed of an electric conductive material levitated/held over a predetermined base without contact with said article, said device comprising:
   current generating sections to generate a current in said article without contact with said article; and
   magnetic field generating sections to generate a magnetic field in a direction perpendicular to said current generated by said current generating sections, wherein a driving force composed of Lorentz force is generated in the direction perpendicular to said current and said magnetic field, whereby said article is positioned.

13. The substrate positioning apparatus for positioning a plate-shaped article made of an electric conductive material over a predetermined base, said apparatus comprising:

a plate-shaped holding body having a through hole for containing a plate-shaped substrate at the center thereof;

levitating units to levitate said plate-shaped substrate and said plate-shaped holding body over said base;

a driving unit including:
 current generating sections to induce a current in said plate-shaped substrate and said plate-shaped holding body, and
 magnetic field generating sections to generate a magnetic field in a direction perpendicular to said current induced by said current generating sections,
 said driving unit to generate a driving force composed of Lorentz force to said plate-shaped substrate and said plate-shaped holding body in the direction perpendicular to said current and said magnetic field and for moving said plate-shaped substrate and said plate-shaped holding body along a front surface of said base by said generated driving force;

first displacement measuring units to measure a displacement of said plate-shaped holding body; and second displacement measuring units to measure the displacement of said plate-shaped substrate to said plate-shaped holding body, wherein said plate-shaped holding body and said plate-shaped substrate are moved through said driving unit in accordance with a result measured by said first and second displacement measuring units, whereby said plate-shaped substrate is positioned without contact therewith.

14. The substrate positioning apparatus according to claim 13, wherein said levitating unit comprises gas feeding units for emitting compressed gas from an opening formed on the front surface of said base.

15. The substrate positioning apparatus according to claim 13, wherein said levitating unit comprises a pair of attracting electrodes arranged over said plate-shaped substrate and said plate-shaped holding body, and a predetermined voltage is applied between said pair of attracting electrodes, whereby said plate-shaped substrate and said plate-shaped holding body are levitated by an electrostatic attraction force.

16. The substrate positioning apparatus according to claim 13, wherein said current generating section has a plurality of electrodes arranged on the front surface of said base, and a predetermined driving voltage is applied between a pair of adjacent electrodes, whereby the current is flowed between regions on said plate-shaped substrate and said plate-shaped holding body opposite to said pair of electrodes.

17. The substrate positioning apparatus according to claim 13, wherein said magnetic field generating section is composed of a magnetic field generating material disposed in said base.

18. The substrate positioning apparatus according to claim 13 further comprising:

an electrostatic capacity detecting unit to detect a change in an electrostatic capacity caused due to the change in a distance from the front surface of said electrodes of said current generating section to the rear surface of said plate-shaped holding body and said plate-shaped substrate, wherein the distance to the rear surface of said plate-shaped holding body and said plate-shaped substrate is measured in accordance with the result detected by said electrostatic capacity detecting unit.

19. The substrate positioning apparatus according to claim 13, wherein said first displacement measuring units are arranged so that they may face to a side surface of said plate-shaped holding body levitated by said levitating units, and said first displacement measuring units are the measuring units for measuring the displacement in at least three positions on the side surface of said plate-shaped holding body, and said second displacement measuring units are arranged so that they may face to an outer peripheral surface of said plate-shaped substrate, and said second displacement measuring units are the measuring units for measuring the displacement in at least three positions on the outer peripheral surface of said plate-shaped substrate, said apparatus further comprising:
 height measuring units arranged so as to face to the front surface or the rear surface of said plate-shaped holding body and said plate-shaped substrate and for measuring the distance to the front surface or the rear surface of said plate-shaped holding body and said plate-shaped substrate.

20. The substrate positioning apparatus according to claim 19, wherein said first displacement measuring unit comprises laser interferometers for emitting measuring light beams onto at least three positions on the side surface of said plate-shaped holding body levitated by said levitating units, and the displacement of said plate-shaped holding body is measured in accordance with values detected by said laser interferometers.

21. The substrate positioning apparatus according to claim 19, wherein said second displacement measuring unit comprises a plurality of gap sensors for sensing a gap between an inner wall of said through hole of said plate-shaped holding body and the outer peripheral surface of said plate-shaped substrate, and the displacement of said plate-shaped substrate to said plate-shaped holding body is measured in accordance with the values detected by said plurality of gap sensors.

22. The substrate positioning apparatus according to claim 13 further comprising:
 attraction force generating units to attract said plate-shaped holding body and said plate-shaped substrate toward said base.

23. The substrate positioning apparatus according to claim 22, wherein said attraction force generating units apply a predetermined voltage between said pair of adjacent electrodes of said current generating section and to generate the electrostatic attraction force to attract said plate-shaped holding body and said plate-shaped substrate toward said base.

24. The substrate positioning apparatus according to claim 22, wherein the voltage applied between said pair of adjacent electrodes of said current generating section is adjusted for each set, whereby the deformation of said plate-shaped substrate is corrected.

25. An exposing apparatus comprising an substrate positioning apparatus according to claim 13 and for exposing a mask pattern image onto a semiconductor wafer positioned by said substrate positioning apparatus.

26. An substrate positioning apparatus for positioning a plate-shaped substrate composed of an electric conductive material over a predetermined base, said apparatus comprising:

levitating units to levitate said plate-shaped substrate over said base;

a driving unit including:
- current generating sections to induce a current in said plate-shaped substrate, and
- magnetic field generating sections to generate a magnetic field in a direction perpendicular to said current induced by said current generating sections,
- said driving unit generating a driving force composed of Lorentz force to said plate-shaped substrate in the direction perpendicular to said current and said magnetic field and for moving said plate-shaped substrate along the front surface of said base by said generated driving force; and
- measuring units to measure a relative position of said plate-shaped substrate to said base, wherein said plate-shaped substrate is positioned through said driving unit in accordance with the position of said plate-shaped substrate measured by said measuring units without contact therewith.

27. The substrate positioning apparatus according to claim 26, wherein said measuring unit has a plurality of electrodes arranged on the front surface of said base, and the position of said plate-shaped substrate is measured in accordance with the change in the electro static capacity caused between the rear surface of said plate-shaped substrate and said plurality of electrodes.

28. A method for making an exposure apparatus that forms an image on an article, comprising the steps of:
- providing an irradiation apparatus that irradiates said article with radiation to form said image on the article;
- providing levitating units which levitate said article in a path of said irradiation;
- providing magnetic field generating sections which generate a magnetic field that generates a driving force that moves said article relative to said irradiation apparatus.

29. A method according to claim 28, further comprising: providing current generating sections which induce a current in said article levitated by said levitating units.

30. A method according to claim 29, wherein said current generating sections induce a current in the article without contact therewith.

31. A method according to claim 29, wherein said magnetic field generating sections generate said magnetic field in a direction perpendicular to said current generated in said article.

32. A method according to claim 29, wherein said driving force is composed of Lorentz forces.

33. A method according to claim 29, further comprising:
- connecting a controller with at least one of said levitating units and said magnetic field generating sections; and
- connecting a sensor that detects a position of said article; and
- controlling, by the controller, the position of said article relative to said radiation in accordance with a detection result of said sensor.

34. An apparatus for positioning a plate-shaped article with respect to a base having a guide surface, comprising:
- a levitation device which levitate the plate-shaped article over said base;
- a driving device which gives a driving force to the plate-shaped article in a direction substantially parallel with said guide surface, said driving device having a magnetic field generating unit and said driving force being generated by utilizing the magnetic field generated by said magnetic field generating unit;
- a detecting unit which detects information relating to a position of the plate-shaped article which is levitated over said base; and
- a control unit connected to said driving device and said detecting units, said control unit controlling said driving device based on the detection result of said detecting units.

35. The apparatus according to claim 34, wherein said magnetic field generating unit is located on said base.

36. The apparatus according to claim 34, wherein said driving device comprises a current generating unit which causes current to generate in the plate-shaped article.

37. The apparatus according to claim 36, wherein said driving force is composed of Lorentz forces generated by said magnetic field and said current.

38. The apparatus according to claim 36, wherein said current generating unit has a plurality of electrodes arranged on a surface of said base to generate current flowing in the plate-shaped article opposed to said electrodes.

39. The apparatus according to claim 36, wherein said levitation device has at least one pair of attracting electrodes arranged opposed to the plate-shaped article to levitate the plate-shaped article by electrostatic attracting force generated when voltage is applied between said pair of electrodes.

40. The apparatus according to claim 36, wherein said detecting unit has a plurality of electrodes arranged on a surface of said base to determine a position of the plate-shaped article in a direction substantially perpendicular to said guide surface based on a change in an electrostatic capacitor caused due to the change in a distance from the rear surface of the plate-shaped article to the front surface of said electrodes.

41. The apparatus according to claim 36, wherein said detecting unit detects information relating to a position of the plate-shaped article in a direction substantially perpendicular to said guide surface and in a direction substantially parallel with said guide surface respectively.

42. An exposure apparatus for forming a predetermined pattern on a plate-shaped article, comprising:
- the apparatus according to claim 36; and
- an irradiation apparatus which irradiates the plate-shaped article with radiation to form an image on the plate-shaped article,
- wherein said levitation device levitates the plate-shaped article in an optical path of the irradiation, and said control unit controls a relative positional relationship between the plate-shaped article and the radiation through said driving device based on the detection result of said detection unit.

43. The apparatus according to claim 36, wherein said detection unit comprises an interferometer which positional relationship between the plate-shaped article and the radiation with respect to a direction substantially parallel with said guide surface.

44. An apparatus for positioning a plate-shaped article with respect to a base having a guide surface, comprising:
- a plate-shaped holding body having a holding section which holds the plate-shaped article;
- a levitation device which levitates the plate-shaped article and the plate-shaped holding body over said base;
- a driving unit which gives a driving force to the plate-shaped article and said plate-shaped holding body in a direction substantially parallel with said guide surface, and has a magnetic field generating unit, said driving force being generated by using magnetic field generated by said magnetic generating unit;

a first detection unit which detects first information relating to a position of said plate-shaped holding body which is levitated over said base;

a second detection unit which detects second information relating to a position of the plate-shaped article with respect to said plate-shaped holding body;

a control unit connected to said driving unit, said first detection unit and said second detection unit, which control said driving unit based on the detection results of said first and second detection units.

45. The apparatus according to claim 44, wherein said magnetic field generating unit is located on said base.

46. The apparatus according to claim 44, wherein said driving device comprises a current generating unit which causes current to generate in the plate-shaped article and said plate-shaped holding body.

47. The apparatus according to claim 44, wherein said driving force is composed of Lorentz forces generated by said magnetic field and said current.

48. The apparatus according to claim 44, wherein said current generating unit has a plurality of electrodes arranged on a surface of said base to generate current flowing in the plate-shaped article and said plate-shaped holding body opposed to said electrodes.

49. The apparatus according to claim 44, wherein said levitation device has at least one pair of attracting electrodes arranged opposed to the plate-shaped article to levitate the plate-shaped article and said plate-shaped holding body by electrostatic attracting force generated when voltage is applied between said pair of electrodes.

50. The apparatus according to claim 44, wherein said detecting unit has a plurality of electrodes arranged on a surface of said base to determine a position of the plate-shaped article in a direction substantially perpendicular to said guide surface based on a change in an electrostatic capacitor caused due to the change in a distance from the rear surface of the plate-shaped article to the front surface of said electrodes.

51. The apparatus according to claim 44, wherein said first detection unit comprises an interferometer which irradiates a measuring beam against said plate-shaped holding body.

52. The apparatus according to claim 44, wherein said second detection unit comprises a gap sensor which measures a distance between said holding section provided in said plate-shaped holding body and the plate-shaped article.

53. The apparatus according to claim 44, wherein said holding section is a through hole provided in said plate-shaped holding body and the plate-shaped article is held in said through hole with non-contact state.

54. An exposure apparatus for forming a predetermined pattern on a plate-shaped article, comprising:

the apparatus according to claim 44; and an irradiation apparatus which irradiates the plate-shaped article with radiation to form an image on the plate-shaped article, wherein said levitation device levitates the plate-shaped article in an optical path of the irradiation, and said control unit controls a relative positional relationship between the plate-shaped article and the radiation through said driving device based on detection results of said first and second detection units.

* * * * *